(12) United States Patent
Mi et al.

(10) Patent No.: US 9,876,479 B2
(45) Date of Patent: Jan. 23, 2018

(54) FILTER

(71) Applicant: FUJITSU LIMITED, Kawasaki-shi, Kanagawa (JP)

(72) Inventors: Xiaoyu Mi, Kawasaki (JP); Satoshi Ueda, Kawasaki (JP); Osamu Toyoda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 8 days.

(21) Appl. No.: 15/150,882

(22) Filed: May 10, 2016

(65) Prior Publication Data

US 2016/0254796 A1 Sep. 1, 2016

Related U.S. Application Data

(62) Division of application No. 14/102,974, filed on Dec. 11, 2013, now abandoned, which is a division of application No. 12/632,098, filed on Dec. 7, 2009, now abandoned.

(30) Foreign Application Priority Data

Dec. 25, 2008 (JP) ................. 2008-329360

(51) Int. Cl.
| | | |
|---|---|---|
| *H01P 1/203* | (2006.01) | |
| *H03H 7/01* | (2006.01) | |
| *H01P 3/08* | (2006.01) | |
| *H01P 1/213* | (2006.01) | |

(52) U.S. Cl.
CPC .......... *H03H 7/0123* (2013.01); *H01P 1/203* (2013.01); *H01P 1/2135* (2013.01); *H01P 1/2136* (2013.01); *H01P 3/082* (2013.01); *H03H 7/0153* (2013.01); *H01P 1/20381* (2013.01)

(58) Field of Classification Search
CPC .... H01P 1/203; H01P 1/20381; H01P 1/2135; H01P 3/082; H03H 7/0153; H03H 7/0123
USPC .................................................. 333/204, 185
See application file for complete search history.

(56) References Cited

U.S. PATENT DOCUMENTS

| | | |
|---|---|---|
| 2,964,718 A | 3/1955 | Packard |
| 5,334,961 A | 8/1994 | Shirai et al. |
| 5,808,527 A | 9/1998 | De Los Santos |
| 5,923,232 A | 7/1999 | Europa et al. |

(Continued)

FOREIGN PATENT DOCUMENTS

| | | |
|---|---|---|
| EP | 1783854 A1 | 5/2007 |
| EP | 1986319 A2 | 10/2008 |

(Continued)

OTHER PUBLICATIONS

Fourn, E et al, "MEMS Switchable Interdigital Coplanar Filter," IEEE Transactions on Microwave Theory and Techniques, vol. 51, No. 1, pp. 320-324, Jan. 2003.

(Continued)

*Primary Examiner* — Rakesh Patel
(74) *Attorney, Agent, or Firm* — Westerman, Hattori, Daniels & Adrian

(57) ABSTRACT

A filter includes a substrate; a signal line formed on the substrate and including an input terminal and an output terminal at either end of the signal line; and a first pair of resonant lines connected between the signal line and a ground portion, wherein the first pair of resonant lines are connected to the signal line at the same point.

5 Claims, 33 Drawing Sheets

(56) References Cited

U.S. PATENT DOCUMENTS

| | | | |
|---|---|---|---|
| 6,054,908 A | 4/2000 | Jackson | |
| 7,889,029 B2 | 2/2011 | Tzuang et al. | |
| 7,944,330 B2 | 5/2011 | Yamao et al. | |
| 2005/0052262 A1* | 3/2005 | Fukunaga | H01P 5/10 333/204 |
| 2005/0068126 A1 | 3/2005 | Muto | |
| 2006/0087388 A1 | 4/2006 | Kawai et al. | |
| 2007/0069838 A1* | 3/2007 | Kayano | H01P 1/20381 333/204 |
| 2007/0149159 A1 | 6/2007 | Kayano | |

FOREIGN PATENT DOCUMENTS

| | | |
|---|---|---|
| JP | 62-30402 A | 2/1987 |
| JP | 5-37244 A | 2/1993 |
| JP | 5-175701 A | 7/1993 |
| JP | 10-335903 A | 12/1998 |
| JP | 2001-7682 A | 1/2001 |
| JP | 2003-309401 A | 10/2003 |
| JP | 2003-332805 A | 11/2003 |
| JP | 2005-500773 A | 1/2005 |
| JP | 2006-128912 A | 5/2006 |
| JP | 2007-174438 A | 7/2007 |
| KR | 10-2005-0031929 A | 4/2005 |
| WO | 03/017417 A1 | 2/2003 |
| WO | 2005/088832 A1 | 9/2005 |
| WO | 2007-029853 A1 | 3/2007 |

OTHER PUBLICATIONS

Peroulis, D et al, "Tunable Lumped Components with Applications to Reconfigurable MEMS Filters," 2001 IEEE MTT-S Digest, p. 341-344.

Tamijani et al, "Miniature and Tunable Filters Using MEMS Capacitors", IEEE Transactions on Microwave Theory and Techniques, vol. 51, No. 7, p. 1878-1885, Jul. 2003.

European Search Report dated Mar. 5, 2010, issued in corresponding European Patent Application No. 09178755.6. (6 pages).

European Office Action dated Jan. 18, 2011, issued in corresponding European Patent Application No. 09178755.6. (1 page).

Korean Office Action dated Mar. 29, 2011, issued in corresponding Korean Patent Application No. 10-2009-0131034. (8 pages).

Japanese Office Action dated Sep. 11, 2012, issued in corresponding Japanese patent application No. 2008-329360, w/ partial English translation. (7 pages).

Japanese Office Action dated Jan. 17, 2013, issued in corresponding Japanese patent application No. 2008-329360, w/ partial English translation. (3 pages).

\* cited by examiner

FILTER

CROSS-REFERENCE TO RELATED APPLICATIONS

This application is a divisional of U.S. application Ser. No. 14/102,974 filed on Dec. 11, 2013, which is a divisional of U.S. application Ser. No. 12/632,098 filed on Dec. 7, 2009, which is based upon and claims the benefit of priority of the prior Japanese Patent Application No. 2008-329360, filed on Dec. 25, 2008, the entire contents of which are incorporated herein by reference.

FIELD

The embodiment discussed herein is related to a filter which allows a predetermined frequency band signal to pass through.

BACKGROUND

In recent years, as well as the market of mobile communication equipment such as a portable telephone growing, the service has become increasingly sophisticated. Along with this, the frequency band utilized by the communication network has shifted to a high frequency band of 1 GHz or higher, and also, there is a trend toward a multiple number of channels.

FIG. 1 is a circuit diagram illustrating a configuration of a related high frequency variable filter. The high frequency variable filter illustrated in FIG. 1 includes a plurality of channel filters 101a to 101c, and switches 102a and 102b. The passbands of the channel filters 101a to 101c differ from one another. A high frequency signal input from an input terminal 103 is output from an output terminal 104 via one channel filter selected by the switches 102a and 102b. By switching the switches 102a and 102b, it is possible to change the passband of the high frequency variable filter.

For example, Japanese Unexamined Patent Publications JP-A 10-335903 and JP-A 2007-174438 disclose the heretofore described kind of high frequency variable filter including the plurality of channel filters and the switches.

However, the configuration illustrated in FIG. 1 includes a number of filters equivalent to the number of channels. For this reason, as well as the size of the high frequency variable filter increasing, a cost also increases. Also, a loss of signal occurs in each switch.

In recent years, attention has been drawn to a small variable filter using an MEMS (Micro Electro Mechanical Systems) switch and an variable capacitor. An MEMS device such as an MEMS switch may be applied to a high frequency band variable filter with a high Q (quality factor).

"D. Peroulis et al, "Tunable Lumped Components with Applications to Reconfigurable MEMS Filters", 2001 IEEE MTT-S Digest, p341-344", "E. Fourn et al, "MEMS Switchable Interdigital Coplanar Filter", IEEE Trans. Microwave Theory Tech., vol. 51, NO. 1, p320-324, January 2003", and "A. A. Tamijani et al, "Miniature and Tunable Filters Using MEMS Capacitors", IEEE Trans. Microwave Theory Tech., vol. 51, NO. 7, p1878-1885, July 2003" disclose the heretofore described kind of MEMS device.

The MEMS device, because of its small size and low loss, is often used in a CPW distributed constant resonator (CPW: Coplanar Waveguide).

"A. A. Tamijani et al, "Miniature and Tunable Filters Using MEMS Capacitors", IEEE Trans. Microwave Theory Tech., vol. 51, NO. 7, p 1878-1885, July 2003" discloses a filter with a structure in which a plurality of MEMS variable capacitors straddle three distributed constant lines. In this filter, by the variable capacitors being displaced to change a gap between the variable capacitors and distributed constant lines, it is possible to change the capacitance. By changing the capacitance of the capacitors, it is possible to change the passband of the filter.

In "A. A. Tamijani et al, "Miniature and Tunable Filters Using MEMS Capacitors", IEEE Trans. Microwave Theory Tech., vol. 51, NO. 7, p1878-1885, July 2003", quartz and glass are used as substrate materials. Also, the drive electrodes of the variable capacitors are disposed in a gap between a ground line and signal line formed on a substrate. Also, the length of the lines is defined by the permittivity of the substrate.

In the heretofore known distributed constant filter, the lower the frequency band, the larger the size. For example, the usable frequency band of principal mobile communication equipment such as a portable telephone is approximately 800 MHz to 6 GHz. However, when the frequency band is 800 MHz to 6 GHz, as the wavelength is long, the size of the distributed constant filter is too large for practical use. For example, in the event that a transmission line with an electrical length of $\lambda/2$ is fabricated to be a 75Ω microstrip line working at 800 MHz by using a ceramic substrate (permittivity $\in$=9.4), the physical length being approximately 77 mm, it is difficult to put the filter into compact handheld wireless communication usage.

By using a high dielectric substrate, it is possible to shorten the length of the lines to some extent. However, when the substrate permittivity becomes higher, it not being possible to form a distributed constant line with a high characteristic impedance, there will be no degree of freedom in a filter configuration. For example, in the event that a microstrip line is formed using a substrate whose permittivity $\in$ is 80, even though a distance between the signal line and ground is increased to 600 μm, a 50Ω (or other similar resistance) signal line may only take up a width of 20 μm. For this reason, a transmission loss increases. Consequently, there is a limit to reducing the filter size by increasing the substrate permittivity.

SUMMARY

A filter includes a substrate, a signal line formed on the substrate, including an input terminal and an output terminal at either end of the signal line, and a first pair of resonant lines connected between the signal line and a ground portion, wherein the first pair of resonant lines are connected to the signal line at the same point.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

1. Configuration of Filter
1-1. Filter Including Pair of Resonant Lines

Figure 1:
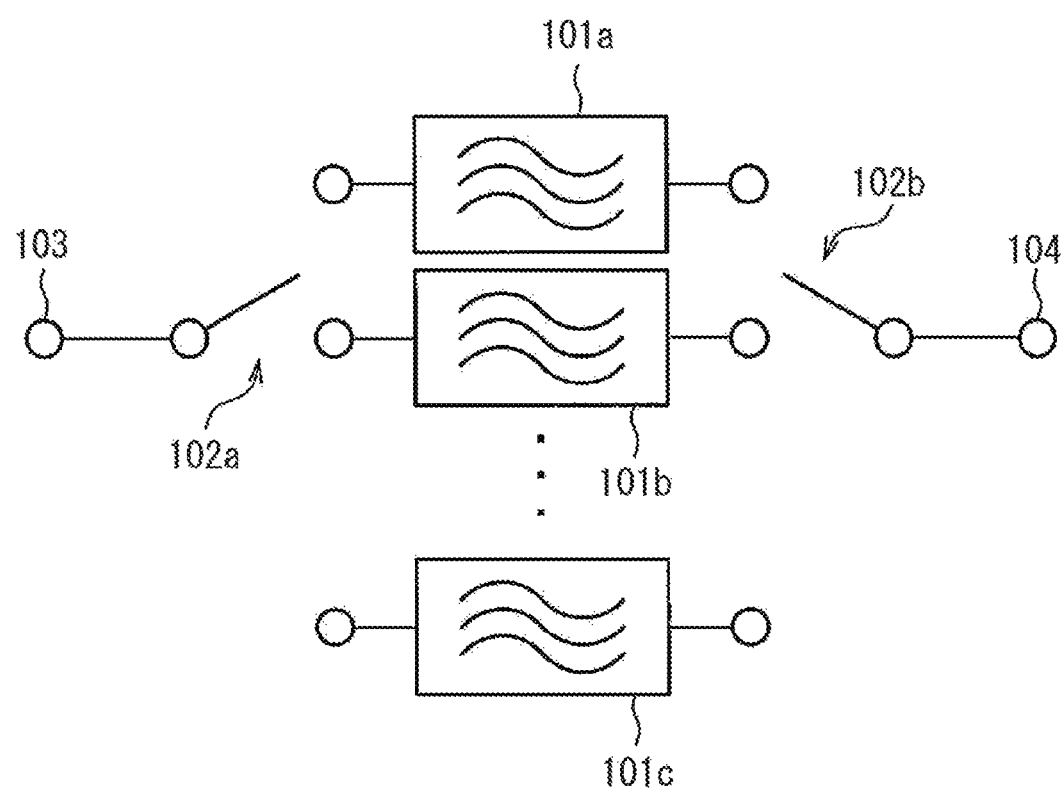
FIG. 1 is a circuit diagram of a configuration of a related filter.
Figure 2:
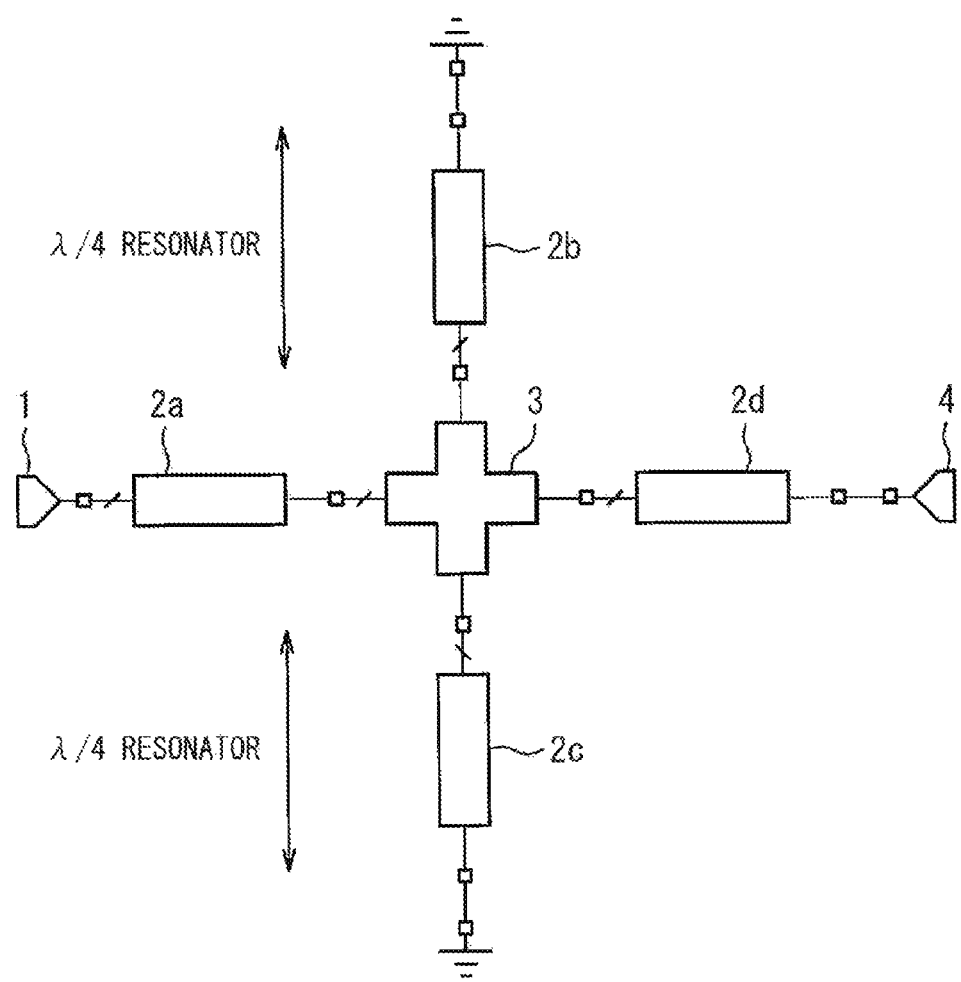
FIG. 2 is a circuit diagram of a filter in the embodiment.

FIG. 2 is a circuit diagram illustrating a basic configuration of a bandpass filter which is one example of a filter of this embodiment. As illustrated in FIG. 2, with the bandpass filter of the embodiment, an input line 2a is connected to an input terminal 1. The input line 2a is connected to a contact point 3. A resonant line 2b and resonant line 2c are connected between the contact point 3 and ground. That is, the resonant lines 2b and 2c are connected in parallel, at the same contact point, to a signal line connecting the input terminal 1 and an output terminal 4. An output line 2d is connected between the contact point 3 and output terminal 4. Also, the input line 2a, resonant lines 2b and 2c, and output line 2d are formed by a distributed constant transmission line. In the embodiment, two resonant lines connected in parallel at the same point are defined as a "pair of resonant lines".

The input-output impedance of the filter illustrated in FIG. 2 is taken to be, for example, 50Ω. Also, the impedance of the resonant lines 2b and 2c, being lower than at least the impedance of the input line 2a and output line 2d, is taken to be, in the embodiment, 20Ω as an example.

The resonant lines 2b and 2c having a length of $(\lambda/8) \times n$ (n is a positive integer), in the filter illustrated in FIG. 2, they have a length of $\lambda/4$ (that is, n=2). $\lambda$ is a wavelength (a resonant wavelength), in the distributed constant transmission line, of the frequency (the resonant frequency of the resonant lines 2b and 2c) of a signal extracted in the filter of the embodiment. Also, each of the resonant lines 2b and 2c means a resonator of which one end is connected to ground, and which is formed by the distributed constant transmission line. By connecting one end of each of the resonant lines 2b and 2c to ground in this way, signals input into the resonant lines 2b and 2c via the input line 2a are filtered by being totally reflected from the ground ends of the resonant lines 2b and 2c, enabling a desired frequency signal to be extracted from the output terminal 4.

A description has been given of an example in which the resonant lines 2b and 2c are connected to ground, but it is also acceptable that they have an open end.

By connecting the resonant lines in parallel to the signal line, and connecting the plurality of resonant lines in the same position in the signal line, as heretofore described, it is possible to shorten a line length between the input line 2a and output line 2d in comparison with a filter in which a plurality of resonators having a line length of $\lambda/2$ are connected in series, as in a heretofore known technology, so it is possible to reduce a size of the filter in a signal line direction.

Also, with the filter illustrated in FIG. 2, the pair of resonant lines 2b and 2c are disposed in positions facing each other across the signal line connecting the input terminal 1 and output terminal 4. Because of this, it is possible to dispose the resonant lines in high density, so it is possible to further reduce the size of the filter in the signal line direction. Even in the event that the resonant lines are disposed on the same side (one side) with respect to the signal line, it is possible to reduce the size of the filter in the signal line direction.

1-2. Filter Including Plurality of Pairs of Resonant Lines

Figure 3:
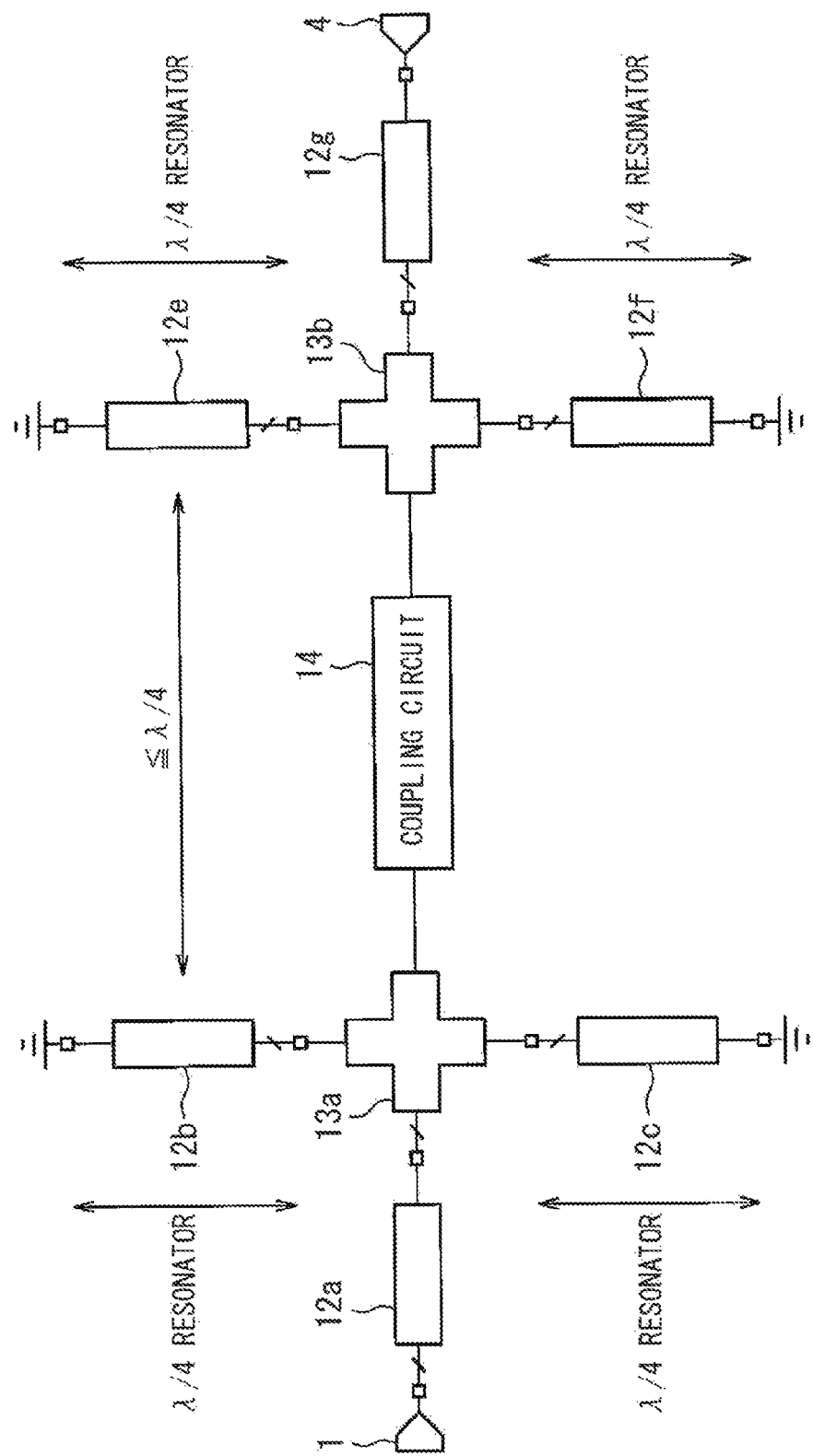
FIG. 3 is a circuit diagram of a configuration of a filter in which a coupling circuit is connected.

FIG. 3 is a circuit diagram of a filter including a plurality of pairs of resonant lines. With the filter illustrated in FIG. 3, an input line 12a is connected to an input terminal 1. The input line 12a is connected to a contact point 13a. A resonant line 12b and resonant line 12c are connected between the connect point 13a and ground. That is, the resonant lines 12b and 12c are connected in parallel to the contact point 13a. Also, the resonant lines 12b and 12c are connected to the same position (the contact point 13a) in the signal line. Meanwhile, on the output side of the filter, an output line 12g is connected between a contact point 13b and output terminal 4. A resonant line 12e and resonant line 12f are connected between the contact point 13b and ground. That is, the resonant lines 12e and 12f are connected in parallel to the contact point 13b. Also, the resonant lines 12e and 12f are connected to the same position (the contact point 13b) in the signal line. In the embodiment, a description has been given of an example in which the resonant lines 12b, 12c, 12e, and 12f are connected to ground, but it is also acceptable that they have an open end.

A coupling circuit 14 is connected between the contact point 13a and contact point 13b. The coupling circuit 14 is a circuit which couples the contact point 13a and contact point 13b in the filter. The coupling circuit 14 may be realized by, for example, a capacitor connected in series between the contact point 13a and contact point 13b.

Also, in the filter illustrated in FIG. 3, it is preferable that the impedance of the resonant lines 12b, 12c, 12e, and 12f is lower than at least the input-output impedance of the filter. This is for configuring in such a way that signals (currents) input from the input terminal 1 flow into the resonant lines 12b, 12c, 12e, and 12f. In the embodiment, as one example, the input-output impedance of the filter is taken to be 50Ω, and the impedance of the resonant lines 12b, 12c, 12e, and 12f to be 20Ω.

In the filter illustrated in FIG. 3, the signals input into the input terminal 1 are input into the resonant lines 12b and 12c via the input line 12a. As one end of each of the resonant lines 12b and 12c is connected to ground, a signal which meets a resonant condition of the resonant lines 12b and 12c is totally reflected from the ground ends of the resonant lines 12b and 12c, but a signal which does not meet the resonant condition, by being grounded, or reflected to the input end side, is attenuated (a filtering). The signal totally reflected from the ground ends of the resonant lines 12b and 12c is input into the resonant lines 12e and 12f via the coupling circuit 14. The filtering of the signal is carried out in the resonant lines 12e and 12f, in the same way as heretofore described, and the filtered signal is output from the output terminal 4 via the output line 12g. As only a predetermined frequency band signal is filtered in each resonant line, it is possible to output the predetermined frequency band signal from the output terminal 4.

Hereafter, a description will be given of a specific configuration of the coupling circuit 14. The coupling circuit 14 may be realized by only the capacitor, as heretofore described, but various other forms are also conceivable.

Figure 4A:
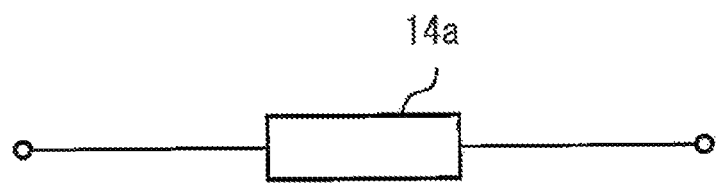
FIGS. 4A to 4N are circuit diagrams of the coupling circuit.
Figure 4B:
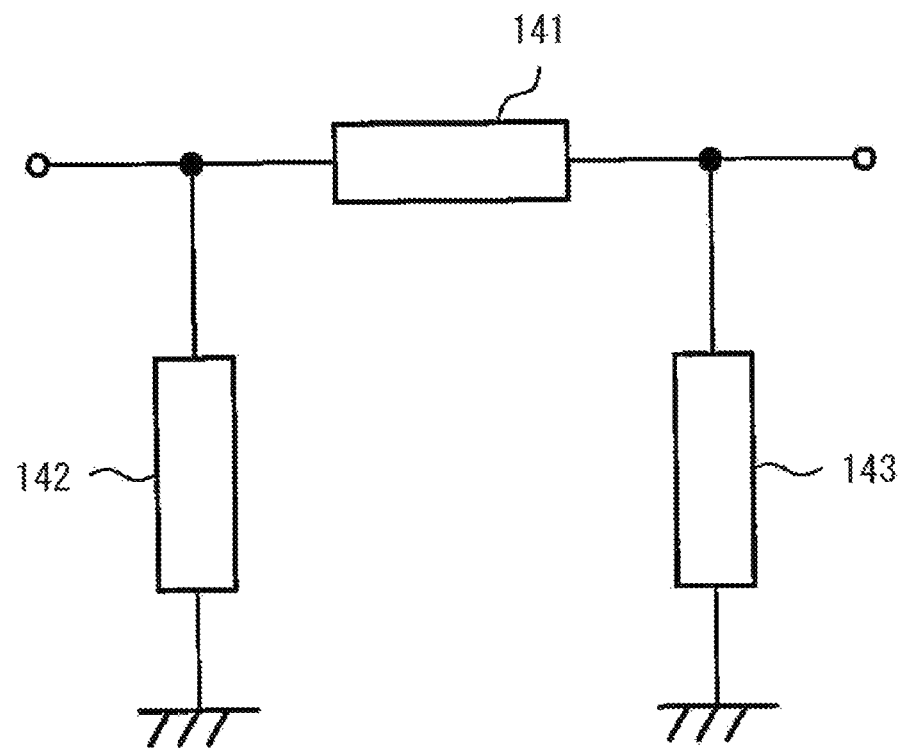
Figure 4C:
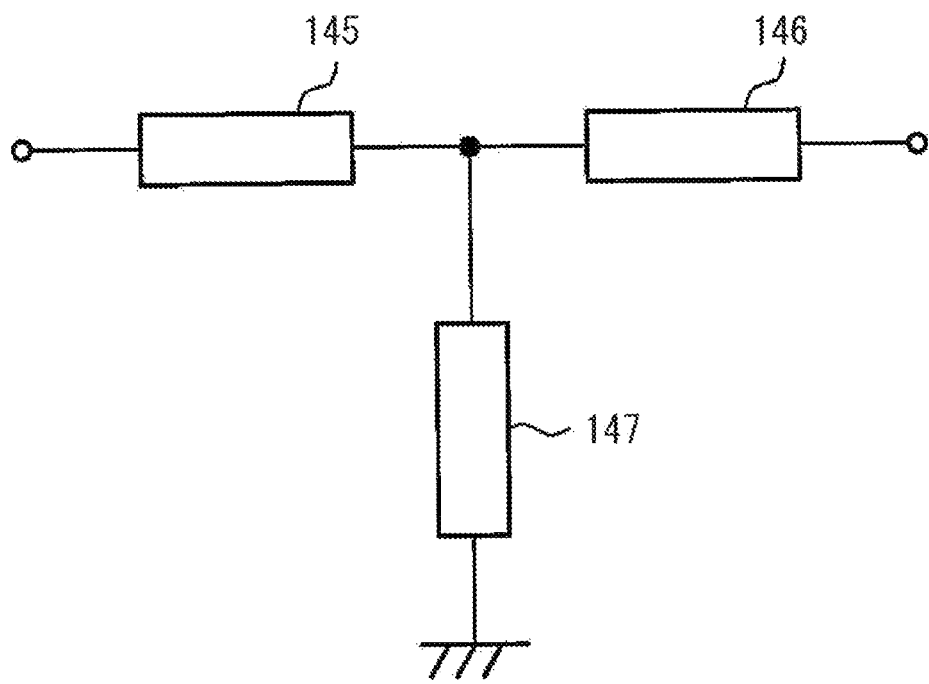

FIGS. 4A to 4C are diagrams illustrating representative coupling circuits. The coupling circuit illustrated in FIG. 4A illustrates a circuit of which the input side and output side are connected by one circuit block. It is a circuit of which the input side and output side are connected by, for example, a distributed constant element 14a as the circuit block. The distributed constant element 14a has an electrical length of λ/4. The impedance of the distributed constant element 14a is approximate to the input-output impedance (for example, about 50Ω) of the filter, and higher than the impedance (for example, 20Ω) of the resonant lines.

The coupling circuit illustrated in FIG. 4B is an example of a π type coupling circuit. With the π type coupling circuit, the input side and output side are connected by a circuit block 141, and both ends of the circuit block 141, and ground, are connected by circuit blocks 142 and 143.

The coupling circuit illustrated in FIG. 4C is an example of a T type coupling circuit. With the T type coupling circuit, the input side and output side are connected by two circuit blocks 145 and 146, and a point between them, and ground, are connected by a circuit block 147. These circuit blocks are realized by a distributed constant element or lumped constant element. The distributed constant element is, for example, a microstrip line, and the lumped constant element is an inductor, a capacitor, or the like. Also the circuit blocks are realized with the individual element or the combination circuit thereof.

FIGS. 4D to 4L illustrate examples of the π type coupling circuit.

Figure 4D:
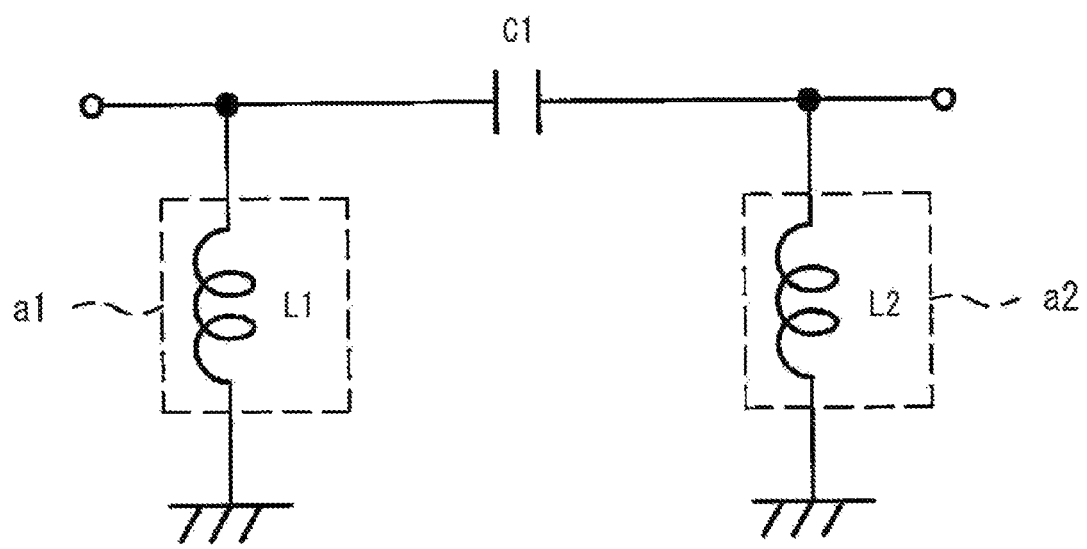

The coupling circuit illustrated in FIG. 4D includes a capacitor C1 connected to the signal line connecting the input terminal and output terminal, and two inductors L1 and L2 connected between the signal line and ground.

Figure 4E:
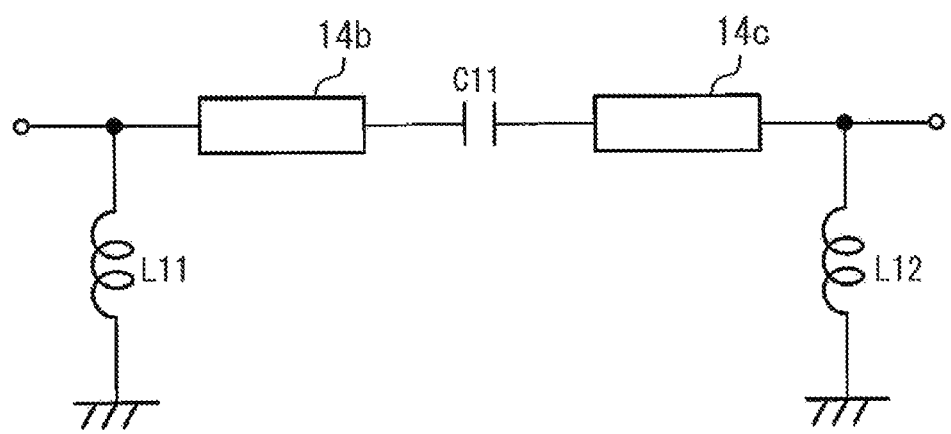

The coupling circuit illustrated in FIG. 4E illustrates a circuit in which the circuit block 141 includes a plurality of elements. This coupling circuit includes two distributed constant elements 14b and 14c, and a capacitor C11, which are connected in series to the signal line, and two inductors L11 and L12 connected between the signal line and ground.

Figure 4F:
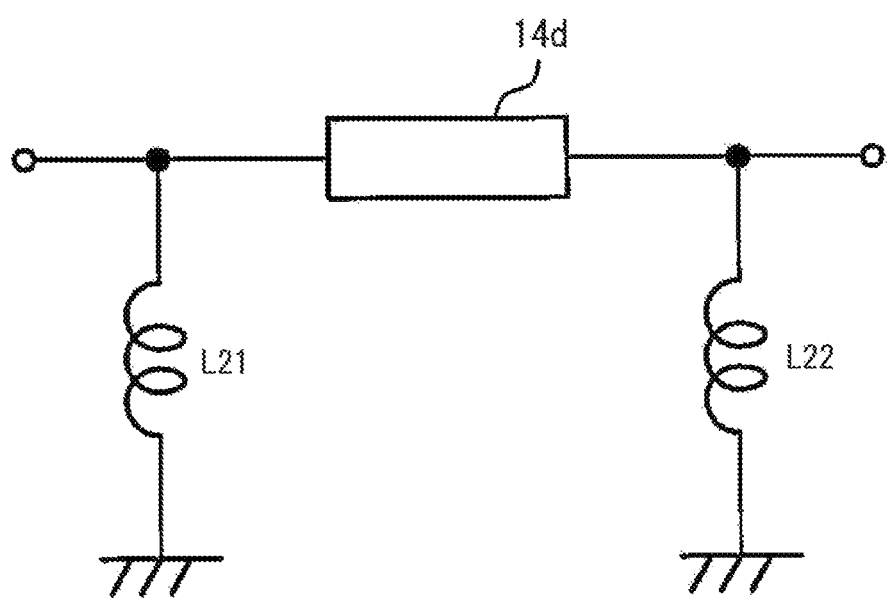

The coupling circuit illustrated in FIG. 4F includes a distributed constant element 14d connected to the signal line, and two inductors L21 and L22 connected between the signal line and ground.

Figure 4G:
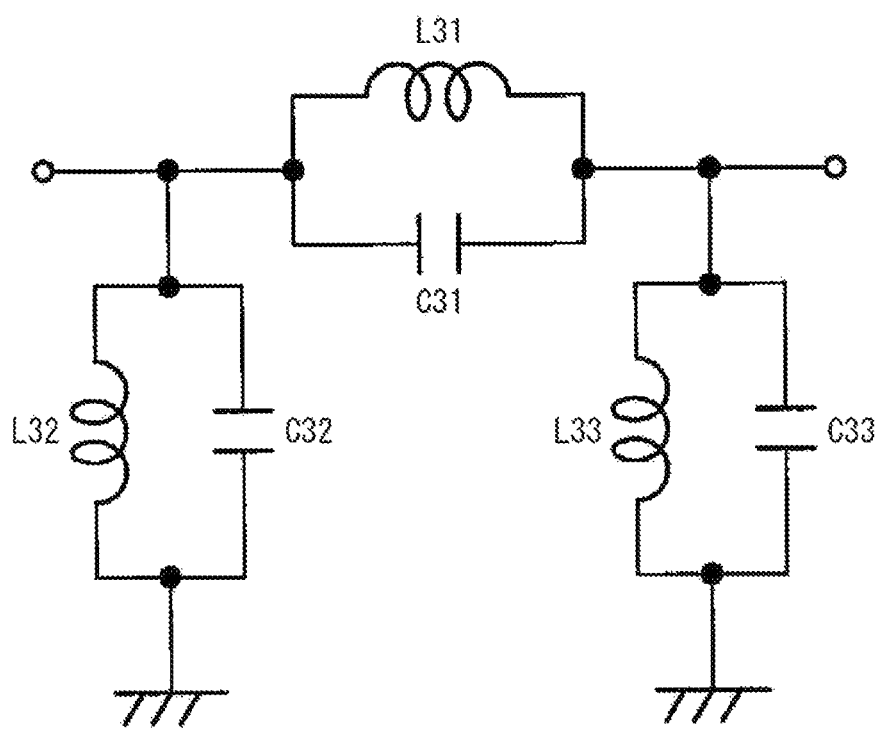

The coupling circuit illustrated in FIG. 4G illustrates a circuit in which each of the circuit blocks 141 to 143 includes combining an inductor and capacitor connected in parallel. This coupling circuit is a circuit in which a combination of an inductor L31 and capacitor C31 connected in parallel is connected to the signal line, and a combination of an inductor L32 and capacitor C32 connected in parallel, and a combination of an inductor L33 and capacitor C33 connected in parallel, are connected between the signal line and ground.

Figure 4H:
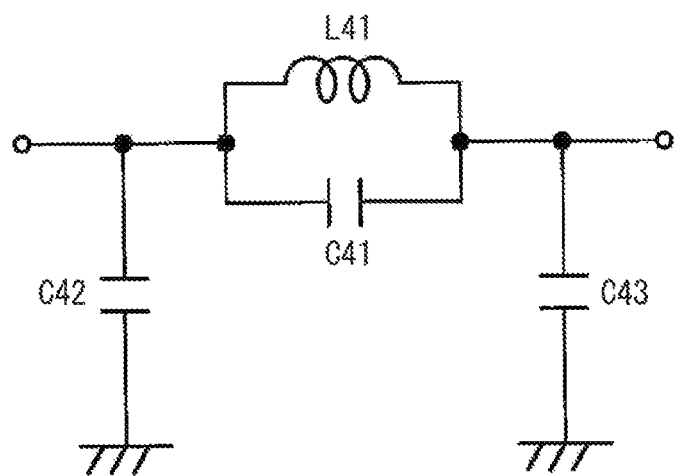

The coupling circuit illustrated in FIG. 4H is a circuit in which a combination of an inductor L41 and capacitor C41 connected in parallel is connected to the signal line, and two capacitors C42 and C43 are connected between the signal line and ground.

Figure 4I:
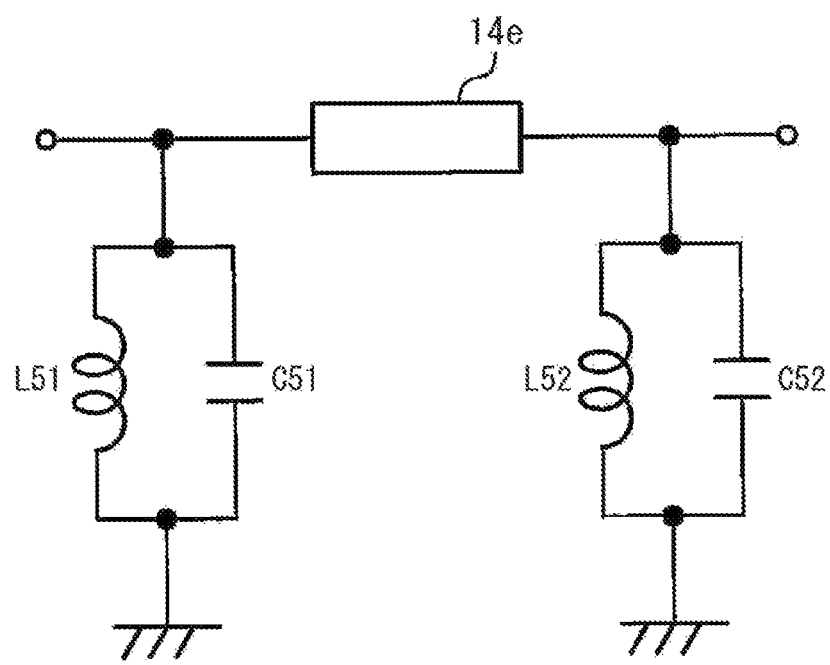

The coupling circuit illustrated in FIG. 4I is a circuit in which a distributed constant element 14e is connected to the signal line, and a combination of an inductor L51 and capacitor C51 connected in parallel, and a combination of an inductor L52 and capacitor C52 connected in parallel, are connected between the signal line and ground.

Figure 4J:
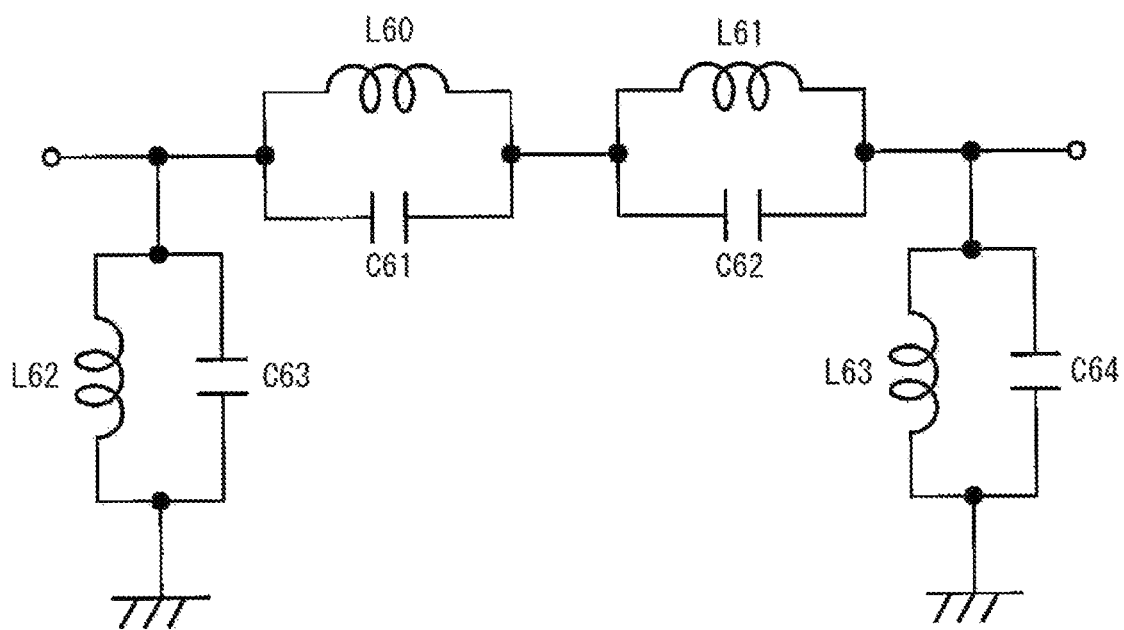

The coupling circuit illustrated in FIG. 4J illustrates a circuit including a circuit block 141 in which an inductor and capacitor connected in parallel are combined, and furthermore, a plurality of the combinations are connected. This coupling circuit is a circuit in which a combination of an inductor L60 and capacitor C61 connected in parallel, and a combination of an inductor L61 and capacitor C62 connected in parallel, are connected in series to the signal line, and a combination of an inductor L62 and capacitor C63 connected in parallel, and a combination of an inductor L63 and capacitor C64 connected in parallel, are connected between the signal line and ground.

Figure 4K:
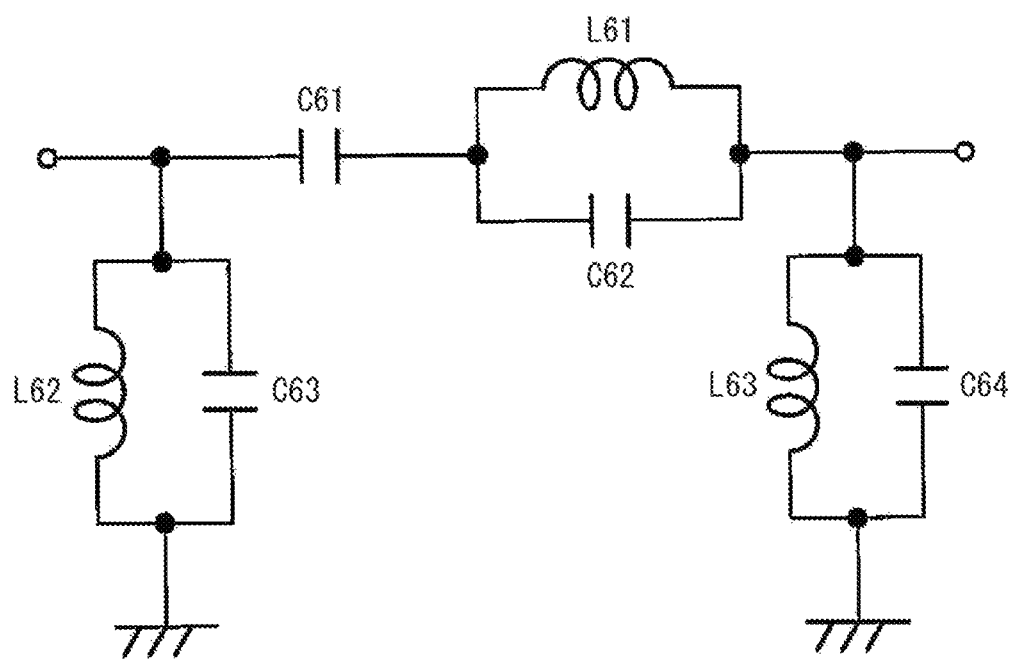

The coupling circuit illustrated in FIG. 4K is a circuit in which the capacitor C61 and the combination of the inductor L61 and capacitor C62 connected in parallel are connected in series to the signal line, and the combination of the inductor L62 and capacitor C63 connected in parallel, and the combination of the inductor L63 and capacitor C64 connected in parallel, are connected between the signal line and ground.

Figure 4L:
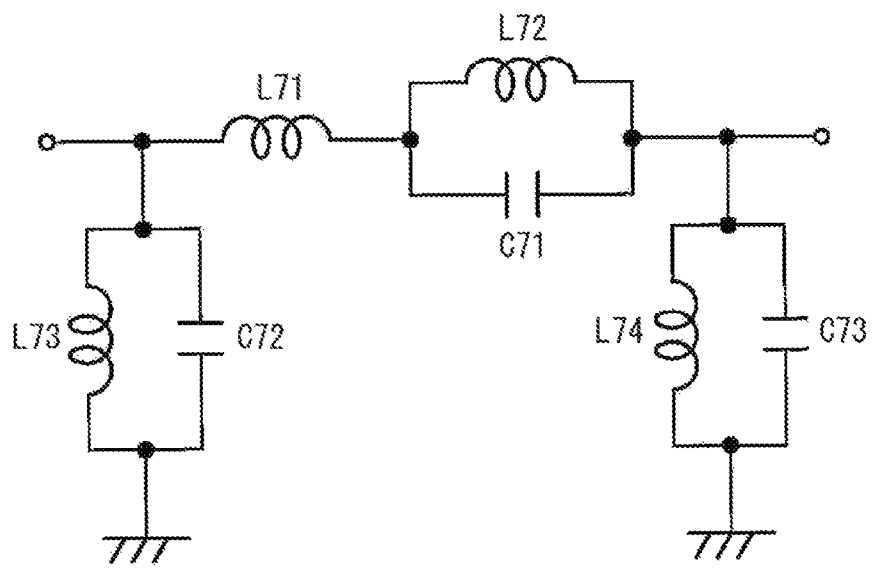

The coupling circuit illustrated in FIG. 4L is a circuit in which an inductor L71 and a combination of an inductor L72 and capacitor C71 connected in parallel are connected to the signal line, and a combination of an inductor L73 and capacitor C72 connected in parallel, and a combination of an inductor L74 and capacitor C73 connected in parallel, are connected between the signal line and ground.

Figure 4M:
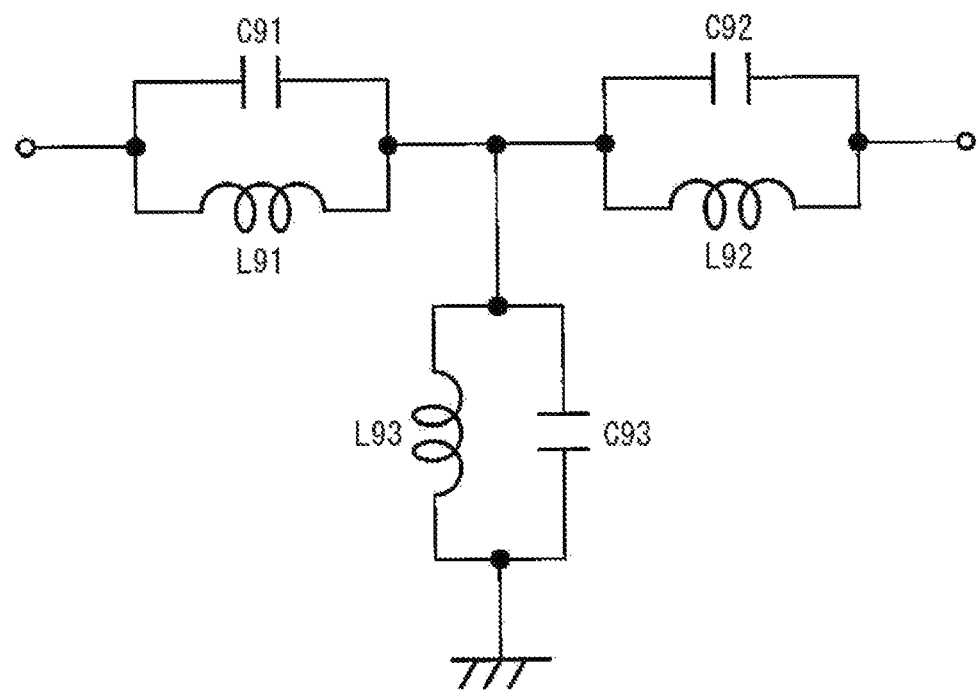
Figure 4N:
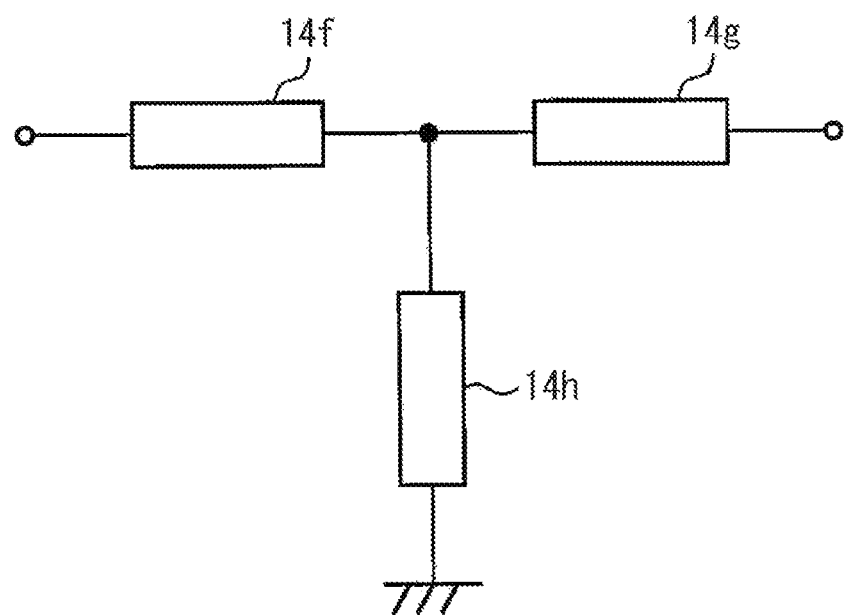

FIGS. 4M and 4N are examples of the T type coupling circuit. FIG. 4M illustrates a circuit in which a combination of a capacitor C91 and inductor L91 connected in parallel, and a combination of a capacitor C92 and inductor L92 connected in parallel, are connected in series to the signal line connecting the input terminal and output terminal, and a combination of a capacitor C93 and inductor L93 connected in parallel is connected between the signal line and ground. The coupling circuit illustrated in FIG. 4N is a circuit which includes distributed constant elements 14f and 14g connected in series to the signal line, and a distributed constant element 14h connected between the signal line and ground.

With a coupling circuit which, being of the π type or T type, includes lumped elements, as illustrated in FIGS. 4E, 4F, and 4I, it is possible to connect a distributed element to one portion.

Also, the π type coupling circuit having two contact points on the signal line connected between the input terminal and output terminal, a lumped constant element or distributed constant element is connected between each contact point and the ground. It is preferable that the elements connected between the contact points and ground have a symmetry. For example, it is preferable that the same element is installed in an a1 section and a2 section in FIG. 4D. In the event of a configuration wherein the same element is installed in the a1 section and a2 section, it is acceptable to install inductors, as illustrated in FIG. 4D or the like, it is acceptable to install capacitors, as illustrated in FIG. 4H, and it is acceptable to install a plurality of lumped constant elements, as illustrated in FIG. 4G or the like.

As illustrated in FIG. 3, by connecting the resonant lines in parallel to the signal line, and connecting the plurality of resonant lines in the same position in the signal line, it is possible to shorten a line length between the input line 12a and output line 12d, in comparison with a filter in which a plurality of resonators having a line length of λ/2 are connected in series, as in a heretofore known technology, so it is possible to reduce the size of the filter in the signal line direction.

Also, with the filter illustrated in FIG. 3, the paired resonant lines 12b and 12c, and the paired resonant lines 12e and 12f, are each disposed in positions facing each other across the signal line connecting the input terminal 1 and output terminal 4. By means of this kind of configuration, it is possible to dispose the lines in high density, so it is possible to further reduce the size of the filter in the signal line direction.

With the filter illustrated in FIG. 3, the electrical length of the resonant lines 12b, 12c, 12e, and 12f is λ/4, but it is possible to make it (λ/8)×n (λ is a resonant wavelength in the resonator, and n is a positive integer). Even in the event of using resonant lines whose electrical length is, for example, λ/8 (that is, n=1), it is possible to obtain the same advantages. In the event of connecting the resonant lines whose line length is λ/8, one end of each resonant line 12b, 12c, 12e, and 12f is connected to ground, as illustrated in FIG. 3. By connecting the resonant lines 12b, 12c, 12e, and 12f whose line length is λ/8 in this way, signals input from the input terminal 1 are input into the resonant line 12b via the contact point 13a, and only a signal which meets the resonant condition of the resonant line 12b is totally reflected from the ground end, while a signal which does not meet the resonant condition, by being grounded, or reflected to the input side, is attenuated. The signal totally reflected from the ground end of the resonant line 12b has a phase difference of λ/2 from the signals input into the contact point 13a from the input terminal 1, and interferes therewith. Because of this, the resonant lines 12b and 12c function in combination as one resonator. The resonated signal, after being resonated again in the same way as heretofore described in the resonant lines 12e and 12f, via the coupling circuit 14, is output from the output terminal 4 via the output line 12g. By this means, it is possible to output a desired frequency band signal from the output terminal 4.

A signal, among the signals input into the input terminal 1, which has a wavelength which does not meet the resonant condition of a resonant line, is attenuated by being grounded, or reflected to the input end side, and is prevented from being output from the output terminal 4. By so doing, the filter performs its function.

With the filter illustrated in FIG. 3, the pair of resonant lines on the input side and the pair of resonant lines on the output side are connected by the one coupling circuit 14. The number of pairs of resonant lines included in the filter not being limited to two, it is possible to connect three or a larger number. A connecting of a much larger number of paired resonant lines may be realized by connecting them by means of a coupling circuit which couples a signal between one pair of resonant lines and another pair of resonant lines, and repeating this kind of connection structure. By this means, the number of resonators included in the whole of the filter increasing, it is possible to realize a filter with a good steepness.

Figure 5:
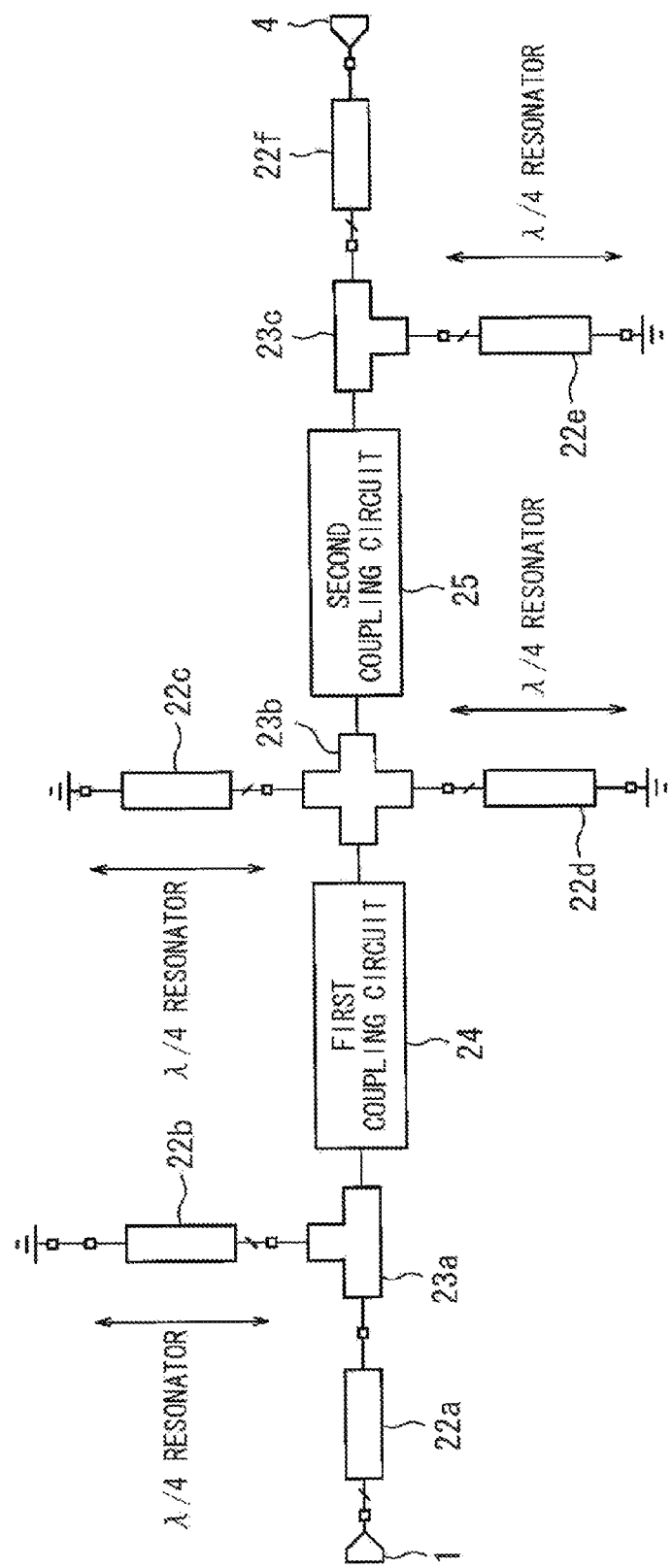
FIG. 5 is a circuit diagram illustrating another configuration of the filter.

FIG. 5 is a circuit diagram illustrating another configuration example of a filter. With the filter illustrated in FIG. 5, an input line 22a is connected between an input terminal 1 and a contact point 23a. A resonant line 22b is connected between the contact point 23a and ground. A first coupling circuit 24 is connected between the contact point 23a and a contact point 23b. A resonant line 22c and resonant line 22d are connected between the contact point 23b and ground. A second coupling circuit 25 is connected between the contact point 23b and a contact point 23c. A resonant line 22e is connected between the contact point 23c and ground. An output line 22f is connected between the contact point 23c and an output terminal 4.

As the first coupling circuit 24 and second coupling circuit 25, it is possible to use the π type coupling circuit or T type coupling circuit. Also, as the π type coupling circuit or T type coupling circuit, it is possible to employ one of the coupling circuits illustrated in FIGS. 4A to 4N. Also, with a coupling circuit which is connected in the π type or T type, includes a lumped constant element, as illustrated in FIGS. 4E, 4F, and 4I, it is possible to connect a distributed constant element to one portion.

In this way, by connecting the resonant lines 22c and 22d in parallel in the same portion in the signal line, it being possible to shorten the line length of the signal line connecting the input terminal 1 and output terminal 4, it is possible to reduce the size of the filter in the signal line direction.

Also, with the filter illustrated in FIG. 5, a description has been given of an example in which the resonant lines 22c and 22e are connected to ground, but it is possible to make the terminals thereof connected to ground an open end. In this case, as it is possible to attenuate a filter passband low frequency side signal level in the resonant line 22b, and attenuate a filter passband high frequency side signal level in the resonant line 22e, it is possible to improve the steepness of the passband characteristics of the filter.

With the filter illustrated in FIG. 5, the input side line and output side line are connected by the first coupling circuit 24 and second coupling circuit 25 but, by increasing the number of coupling circuits, it is possible to connect still more paired resonant lines connected between the signal line and ground.

1-3. Ground Sharing of Resonant Lines

It is acceptable that the ground ends of the resonant lines 12b, 12c, 12e, and 12f illustrated in FIGS. 3 and 5 are connected one to each independent ground, and it is also acceptable that they are connected to an identical ground.

Figure 6A:
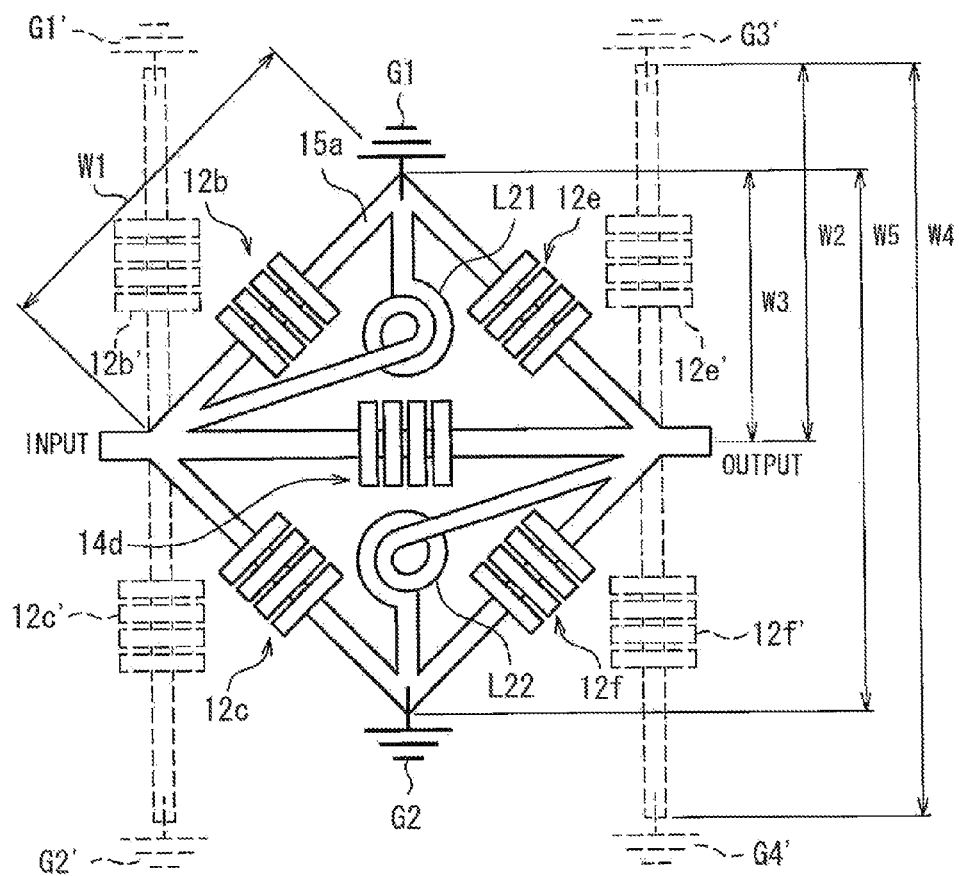
FIG. 6A is a plan view of a configuration wherein resonant lines are connected to a common ground.

FIG. 6A is a plan view illustrating a specific configuration of a filter. In the filter illustrated in FIG. 6A, the circuit illustrated in FIG. 4F is employed as the coupling circuit 14. In the components illustrated in FIG. 6A, components identical to the components illustrated in FIGS. 3 and 4F are given identical reference numerals and characters. Also, in FIG. 6A, resonant lines 12b', 12c', 12e', and 12f' connected one to each independent ground are depicted by the broken lines, while resonant lines 12b, 12c, 12e, and 12f connected to an identical ground are depicted by the solid lines. The line lengths of the resonant lines 12b, 12c, 12e, 12f, 12b', 12c', 12e', and 12f' are all taken to be W1. Also, the resonant lines 12b, 12c, 12e, and 12f, and a distributed constant element 14d, are each constructed in such a way that a plurality of capacitor electrodes straddle a signal line (a description of the capacitor electrodes will be given hereafter). Also, the resonant lines 12b and 12e are connected to an identical ground G1. Also, the resonant lines 12c and 12f are connected to an identical ground G2. Also, the resonant line 12b' is connected to a ground G1'. Also, the resonant line 12c' is connected to a ground G2'. Also, the resonant line 12e' is connected to a ground G3'. Also, the resonant line 12f' is connected to a ground G4'. The grounds G1' to G4' are physically independent of one another.

As illustrated by the broken lines in FIG. 6A, in the event that the resonant lines 12b' and 12e' are disposed so as to be perpendicular to the signal line of which both ends are connected to input and output terminals, and connected to the mutually independent grounds G1' and G3', a disposition space of a dimension W2 (W2=W1) is needed in a direction perpendicular to the signal line. In the same way, in the event that the resonant lines 12c' and 12f' are disposed so as to be perpendicular to the signal line of which both ends are connected to the input and output terminals, and connected to the mutually independent grounds G2' and G4', a disposition space of a dimension the same as the dimension W2 is needed in the direction perpendicular to the signal line. Consequently, the size of the filter in the vertical direction (the direction perpendicular to the signal line) is W4 which is approximately twice W2.

As opposed to this, as illustrated by the solid lines in FIG. 6A, by connecting the resonant line 12b and resonant line 12e to the ground G1, and disposing them at an angle with respect to the signal line, it is sufficient that a space for disposing the resonant lines 12b and 12e is of a dimension W3 (W3<W2) in the direction perpendicular to the signal line. In the same way, by connecting the resonant line 12c and 12f to the ground G2, and disposing them at an angle with respect to the signal line, it is sufficient that a space for disposing the resonant lines 12c and 12f is of a dimension the same as the dimension W3 in the direction perpendicular to the signal line. Consequently, it is possible to make a dimension W5 (W5=W3×2) of the filter in the vertical direction smaller than a dimension W4. In this way, by connecting a plurality of resonant lines to ground at the same contact point, it is possible to reduce a space in which the resonant lines are disposed.

Figure 6B:
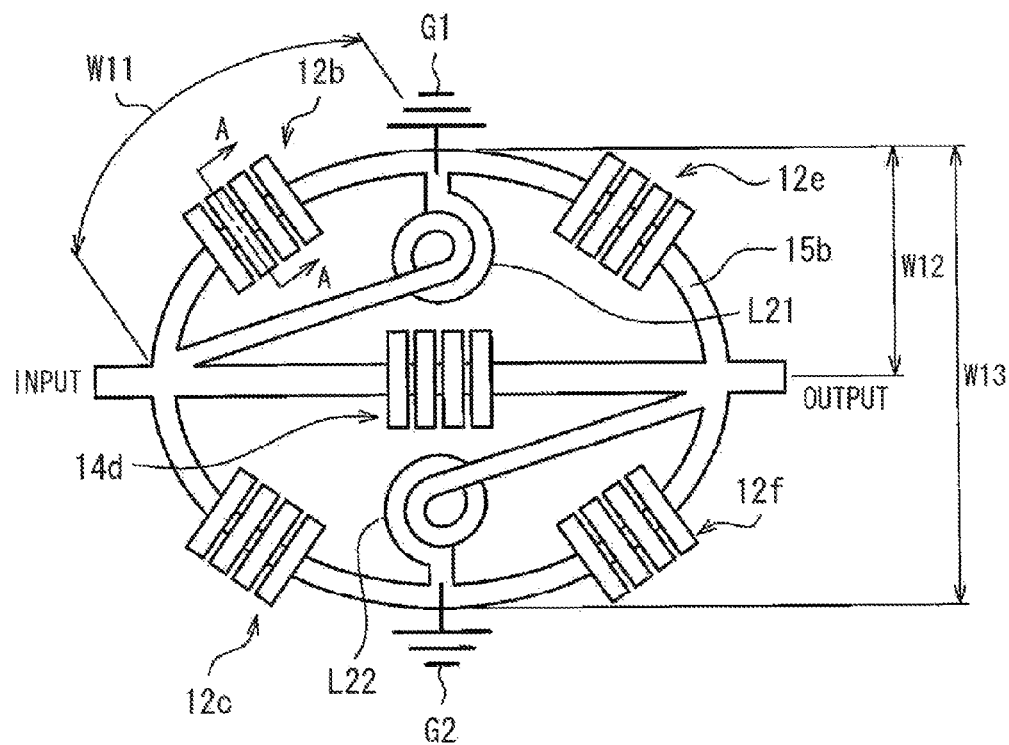
FIG. 6B is a plan view of a configuration wherein resonant lines are formed into an arc shape.

FIG. 6B illustrates another example of a filter in which resonant lines are connected to an identical ground. The filter illustrated in FIG. 6B differs from the filter illustrated in FIG. 6A in that the resonant lines 12b, 12c, 12e, and 12f are formed into an arc shape. A line length W11 of each resonant line 12b, 12c, 12e, and 12f is the same as the line length W1 of the resonant lines illustrated in FIG. 6A.

In this way, by forming the resonant lines 12b, 12c, 12e, and 12f into the arc shape, it is possible to make a dimension W12 of a resonant line disposition space in the direction perpendicular to the signal line smaller than the dimension W2 illustrated in FIG. 6A. Consequently, it is possible to make a dimension W13 of the filter in the vertical direction (the direction perpendicular to the signal line) smaller than the dimension W4 illustrated in FIG. 6A.

Also, it is possible to make the dimension W12 of the resonant line disposition space in the direction perpendicular to the signal line much smaller than the dimension W3 illustrated in FIG. 6A. Consequently, it is possible to make the dimension W13 of the filter in the vertical direction (the direction perpendicular to the signal line) much smaller than the dimension W5 illustrated in FIG. 6A.

The heretofore described filter configuration which enables miniaturization is also advantageous for a loss reduction. A loss of the filter basically depends on a line conductor loss. By miniaturizing the filter, it being possible to shorten the line length of the filter, it is possible to reduce a signal passing loss.

Also, by miniaturizing the filter, it being possible to increase the number (an available number) of filters which may be fabricated from one wafer at a time of filter manufacture, it is possible to reduce a cost per element.

The filter according to the embodiment may be used as, for example, a small GHz band frequency variable filter using an MEMS variable capacitor.

2. Configuration of Variable Filter

With the capacitance of the resonant lines 12b, 12c, 12e, and 12f illustrated in FIG. 3, as a capacitance between them and grounds (to be described hereafter) disposed in a substrate is of a fixed value, the passband of the filter illustrated in FIG. 3 is fixed. As opposed to this, by mounting a movable capacitor electrode (to be described hereafter) on the resonant lines 12b, 12c, 12e, and 12f, and coupling circuit 14, illustrated in FIG. 3, it is possible to realize a variable filter which may vary the passband. Also, by mounting a movable capacitor electrode on the resonant lines 22b, 22c, 22d, and 22e, and coupling circuits 24 and 25 in FIG. 5, it is possible to realize a variable filter which may vary the passband. By mounting the movable capacitor electrode on the resonant lines, it is possible to shorten the line length and, as well as it being possible to further miniaturize the filter, it is possible to vary the passband. Also, by mounting the movable capacitor electrode on the coupling circuit, it is possible to equivalently change the electrical length of the resonator in such a way as to provide a coupling circuit in accordance with the passband varied in the resonant lines. A description has been given of an example in which these variable filters have the variable capacitors, but it is also acceptable to realize them with variable inductors. Furthermore, it is acceptable to realize the variable filters by appropriately combining the variable capacitors and variable inductors.

In the event that a coupling circuit including only lumped constant elements is installed in the variable filter, as illustrated in FIGS. 4D, 4G, 4H, 4J, 4K, 4L, and 4M, it is sufficient to change at least one lumped constant element, among the lumped constant elements included in the coupling circuit, to a variable element. For example, in the event that the coupling circuit illustrated in FIG. 4D is installed, by changing the capacitor C1 to a variable capacitor, it is possible to realize the coupling circuit in accordance with the passband.

Also, in the event that a coupling circuit including a lumped constant element and distributed constant element is installed in the variable filter, as illustrated in FIGS. 4E, 4F, and 4I, by installing a movable capacitor electrode as the lumped constant element included in the coupling circuit, it is possible to realize the coupling circuit in accordance with the passband.

Also, in the event that a coupling circuit including a plurality of distributed constant elements is installed in the filter, as illustrated in FIG. 4N, by installing a movable capacitor electrode as at least one distributed constant element, among the distributed constant elements 14f, 14g, and 14h included in the coupling circuit, it is possible to realize the variable filter.

By installing the variable capacitor electrode in the resonant lines, as in the embodiment, it being possible to change the capacitance in the resonant lines, it is possible to change a signal passband in the resonant lines. By installing the resonant lines, in which the passband is variable, in the filter in this way, it is possible to realize the variable filter.

Hereafter, a description will be given of a specific configuration of the resonant lines including the movable capacitor electrode (hereafter referred to as the variable capacitor element).

2-1. Configuration of Variable Capacitor Element

Figure 7A:
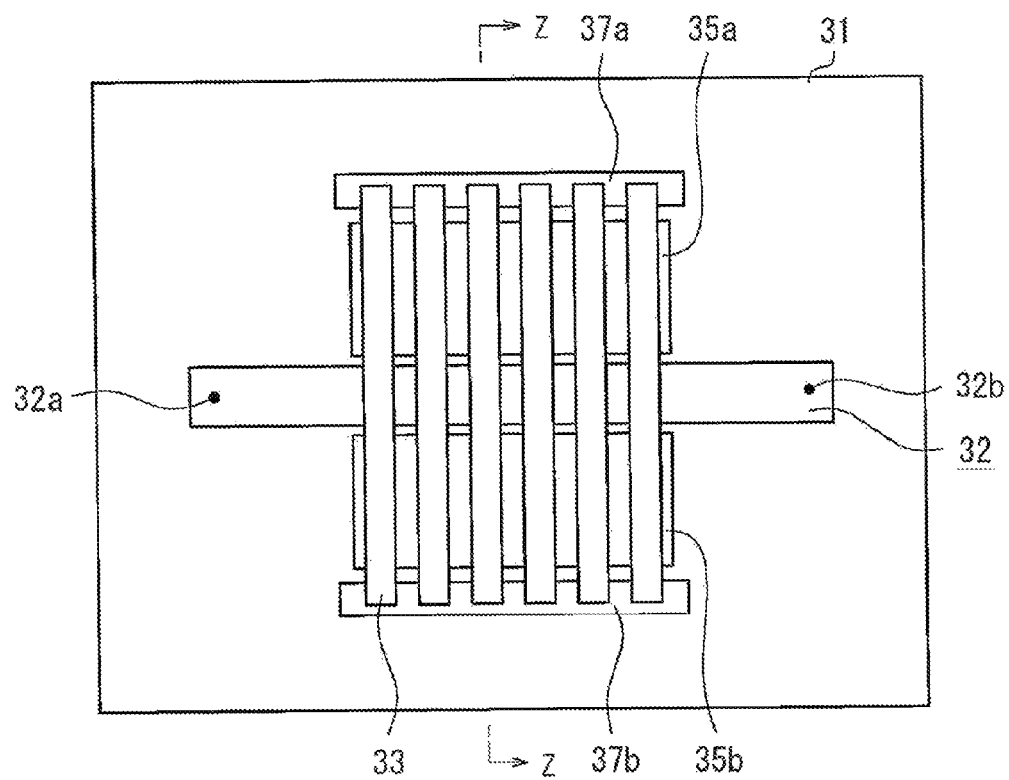
FIG. 7A is a plan view of a resonant line of a variable filter element taken along the line A-A in FIG. 6B.
Figure 7B:
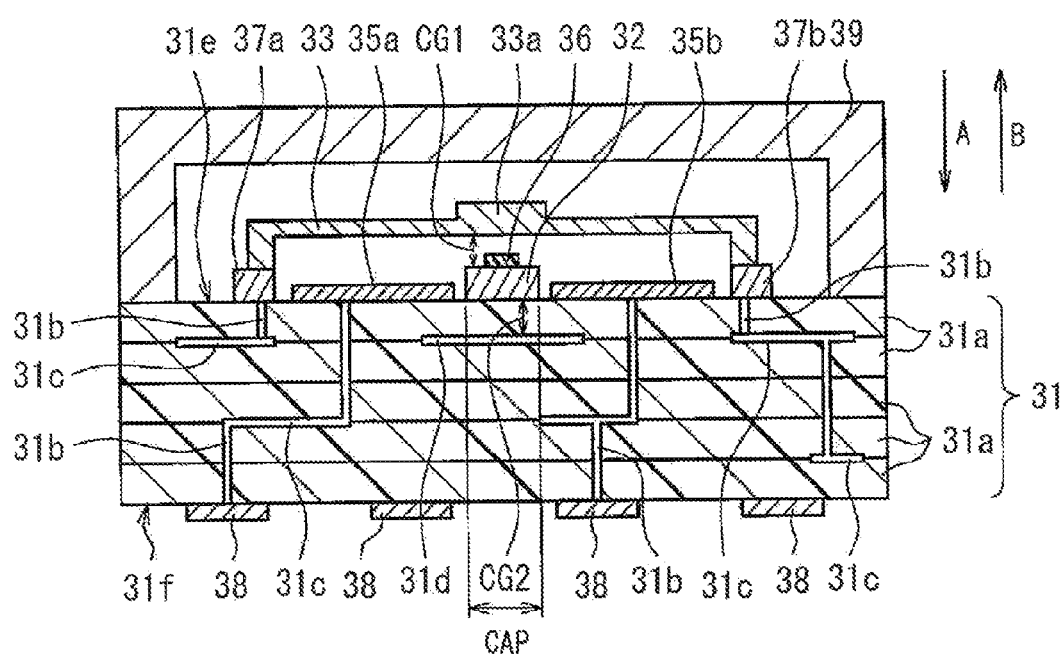
FIG. 7B is a sectional view taken along Z-Z in FIG. 7A.

FIG. 7A is a plan view of the variable capacitor element. FIG. 7B is a sectional view of a Z-Z section in FIG. 7A.

The variable capacitor element illustrated in FIGS. 7A and 7B, including a substrate 31, a signal line 32, movable capacitor electrodes 33, drive electrodes 35a and 35b, a dielectric dot 36, anchor sections 37a and 37b, electrode pads 38, and a packaging member 39, is configured as one portion of a filter which allows a passage of an electromagnetic wave or electrical signal in a specified high frequency band. The packaging member 39 seals not only a variable capacitor element section, but the whole of the filter.

The substrate 31 is an LTCC wafer (LTCC: Low Temperature Co-fired Ceramics) including multilayer internal wirings (wiring patterns 31c). The substrate 31 is formed by mutually bonding a plurality (five in the substrate illustrated in FIG. 7B) of insulating layers 31a. A via 31b which includes a conductive portion in a through hole formed from one principal surface to the other principal surface is formed in each insulating layer 31a. Also, each wiring pattern 31c is sandwiched between at least one pair of adjacent insulating layers 31a. Also, one portion of the wiring pattern 31c positioned on a side of the substrate 31 closest to a first surface 31e is a ground line 31d connected to ground. The ground line 31d faces the signal line 32 across the insulating layer 31a, and the ground line 31d and signal line 32 have a gap CG2 between them. Regarding the ground line 31d illustrated in FIG. 7B, an example has been described in which it is disposed in a position close to the first surface but, it not being limited to this, it is also acceptable to dispose it on another layer. In this case, the ground line 31d faces the signal line 32 across a plurality of the insulating layers 31a. For this reason, the gap CG2 between the ground line 31d and signal line 32 is equivalent to a thickness to which the plurality of insulating layers 31a are stacked. Also, the wiring patterns 31c are connected, and the wiring patterns 31c and electrode pads 38 are connected, by the vias 31b. In some cases, it is acceptable that the wiring patterns 31c and signal line 32 are connected by the vias 31b. Also, the insulating layers 31a are realized by an LTCC. However, their not being limited to the LTCC, it is acceptable to form them from another dielectric body.

The signal line 32, as illustrated in FIG. 7A, including a terminal 32a and terminal 32b at both ends in its longitudinal direction, is a conductor pattern in which an electrical signal passes between the terminals 32a and 32b. The terminals 32a and 32b, by being connected to other elements on the wiring substrate, or made an open end, are electrically connected to predetermined electrode pads 38 via predetermined vias 31b and wiring patterns 31c in the wiring substrate 31 (not illustrated). Also, the signal line 32, being a distributed constant transmission line of which the impedance is, for example, 20Ω, is formed from a low resistance metal material such as, for example, Cu, Ag, Au, Al, W, or Mo. Also, the thickness of the signal line 32 is, for example, 0.5 to 20 μm.

Both ends of each movable capacitor electrode 33 are fixed to the anchor sections 37a and 37b formed on the first surface 31e of the substrate 31, and a main portion thereof excluding both ends faces the signal line 32 and drive electrodes 35a and 35b across an air gap. A thick section 33a is formed in a portion of each movable capacitor electrode 33 facing the signal line 32. The thick sections 33a and signal line 32 face each other across a gap CG1. The movable capacitor electrodes 33 are connected to ground via the anchor sections 37a and 37b, vias 31b, and wiring patterns 31c. The movable capacitor electrodes 33, being formed from an elastically deformable material, may be formed from, for example, a low resistance metal such as, for example, Au, Cu, or Al. The variable capacitor element whose capacitance changes is realized by the movable capacitor electrodes 33 being moved to change a distance between the movable capacitor electrodes 33 and signal line 32. Also, the gap CG1 between the movable capacitor electrodes 33 and signal line 32 may be made, for example, 0.1 to 10 μm. Also, the movable capacitor electrodes 33 and ground line 31d are one example of a ground wiring section in the embodiment.

The drive electrodes 35a and 35b, being disposed adjacent to the signal line 32, face one portion of each movable capacitor electrode 33. The drive electrodes 35a and 35b generate an electrostatic attractive force between themselves and the movable capacitor electrodes 33, enabling the movable capacitor electrodes 33 to be displaced in a direction indicated by an arrow A. By the movable capacitor electrodes 33 being displaced by the action of the drive electrodes 35a and 35b, a capacitance between the signal line 32 and movable capacitor electrodes 33 changes. The drive electrodes 35a and 35b are formed from a high resistance metal thin film such as, for example, a SiCr thin film. Also, in order to suppress an occurrence of a pull-in phenomenon, it is preferable that a gap between the drive electrodes 35a and 35b and movable capacitor electrodes 33 is made equal to or more than three times the gap CG1 between the movable capacitor electrodes 33 and signal line 32.

The dielectric dot 36, being provided on the signal line 32, is formed from a dielectric material such as, for example, Al2O3, SiO2, SixNy, or SiOC. The dielectric dot 36, as well as being able to prevent the signal line 32 and movable capacitor electrodes 33 from short circuiting, may increase a capacitance occurring in the gap CG1 between the signal line 32 and movable capacitor electrodes 33. It is preferable to increase the capacitance because it is thereby possible to ensure a wide filter frequency variable range.

The packaging member 39 seals structures of the filter which, being bonded to the first surface 31e of the substrate 31, are formed on the first surface 31e of the substrate 31.

In the variable capacitor element illustrated in FIGS. 7A and 7B, a first capacitor is formed by the gap CG2 being formed between the signal line 32 and the ground line 31d disposed in the substrate 31. Also, a second capacitor is formed by the gap CG1 being formed between the signal line 32 and movable capacitor electrodes 33. By forming two capacitors in this way, it is possible to increase the capacitance. Consequently, with these capacitors, it is possible to increase the capacitance in comparison with a microstrip line or distributed constant element which includes only the first capacitor, as heretofore known. That is, with these capacitors, it is possible to increase the capacitance in comparison with a microstrip line or distributed constant element which includes no movable capacitor electrode. By increasing the capacitance, it is possible to shorten the physical signal line length of a resonant line including a variable distributed constant element. Therefore, by installing this kind of variable capacitor element in the filter, it being possible to shorten the line length of the resonant line, it is possible to miniaturize the filter.

Also, by applying a voltage to the drive electrodes 35a and 35b via the electrode pads 38, vias 31b and wiring patterns 31c, it is possible to generate an electrostatic attractive force between the drive electrodes 35a and 35b and movable capacitor electrodes 33, and elastically displace the movable capacitor electrodes 33 in the direction indicated by the arrow A. By displacing the movable capacitor electrodes 33, it is possible to reduce the gap CG1 between the signal line 32 and movable capacitor electrodes 33. By reducing the gap CG1, it is possible to increase the capacitance in the second capacitor. By increasing the capacitance, the line length of the distributed constant element increases equivalently or essentially, and a resonated frequency band is shifted to a low frequency side.

Also, the drive electrodes 35a and 35b, as well as being divided for each movable capacitor electrode 33, are configured so that a voltage may be applied to each individual one. Then, by selectively applying a voltage to the divided drive electrodes 35a and 35b, the plurality of movable capacitor electrodes 33 are selectively displaced. The movable capacitor electrodes 33 are selectively displaced, thereby enabling changes in capacitance to differ in magnitude.

Also, as the electrostatic attractive force occurring between the drive electrodes 35a and 35b and movable capacitor electrodes 33 is diminished by decreasing the voltage applied to the drive electrodes 35a and 35b, a displacement amount of the movable capacitor electrodes 33 decreases, enabling the movable capacitor electrodes 33 to return in a direction indicated by an arrow B. By returning the movable capacitor electrodes 33 in the direction indicated by the arrow B, the gap CG1 between the signal line 32 and movable capacitor electrodes 33 increases, and the capacitance in the second capacitor decreases. By the capacitance decreasing, the electrical length of the distributed constant element decreases equivalently or essentially.

In this way, by adjusting the voltage applied to the drive electrodes 35a and 35b, and displacing the movable capacitor electrodes 33 in a direction approaching the signal line 32, it is possible to make the second capacitor a variable capacitor, and it is possible to change a signal passing frequency band in the variable filter element. It is possible to realize the variable filter by installing this kind of variable capacitor element in, for example, the resonant lines 12b, 12c, 12e, and 12f, and coupling circuit 14 illustrated in FIG. 3, or the resonant lines 22b, 22c, 22d, and 22e, and coupling circuit 24 illustrated in FIG. 5.

Also, with a commonly known CPW signal line, a signal line (one being an example) and ground lines (for example, two) being provided on the same surface of a substrate, as a drive electrode for driving a movable capacitor electrode is disposed between the signal line and the ground lines, there is a limitation on a drive electrode disposition space, and there is a limit to increasing the area of the drive electrode. As opposed to this, as the variable filter element using the microstrip line, illustrated in FIGS. 7A and 7B has no ground line provided on a surface of the substrate the same as the surface on which the signal line is formed, it is possible to secure a large area of the drive electrodes 35a and 35b on the substrate 31. By securing the large area of the drive electrodes 35a and 35b, it being possible to reduce the voltage applied to the drive electrodes 35a and 35b when displacing the movable capacitor electrode 33, it is possible to secure a wide movable range of the movable capacitor electrodes 33. Also, by reducing the drive voltage, it is possible to reduce a power consumption.

Also, it is conceivable that, by increasing the area of the drive electrodes 35a and 35b, it is possible to suppress a self-actuation phenomenon due to a high frequency signal. That is, as it is possible, by increasing the area of the drive electrodes 35a and 35b, to increase the electrostatic attractive force occurring between the drive electrodes 35a and 35b and movable capacitor electrodes 33, it is possible to form the movable capacitor electrodes 33 from an elastic body with a high rigidity. Furthermore, the higher the area ratio of the drive electrodes 35a and 35b and a capacitor section CAP, a coulomb force occurring between the signal line 32 and movable capacitor electrodes 33 due to a high frequency signal passing through the capacitor section CAP becomes negligible compared with a coulomb force occurring between the drive electrodes 35a and 35b and movable capacitor electrodes 33 due to the drive voltage. Consequently, in the embodiment, it is conceivable that the increase in the area of the drive electrodes 35a and 35b is advantageous for a suppression of the self-actuation phenomenon of a parallel plate type variable capacitor.

2-2. Method of Manufacturing Variable Filter Element

FIGS. 8A to 8G are sectional views illustrating a process of manufacturing the variable filter element.

Figure 8A:
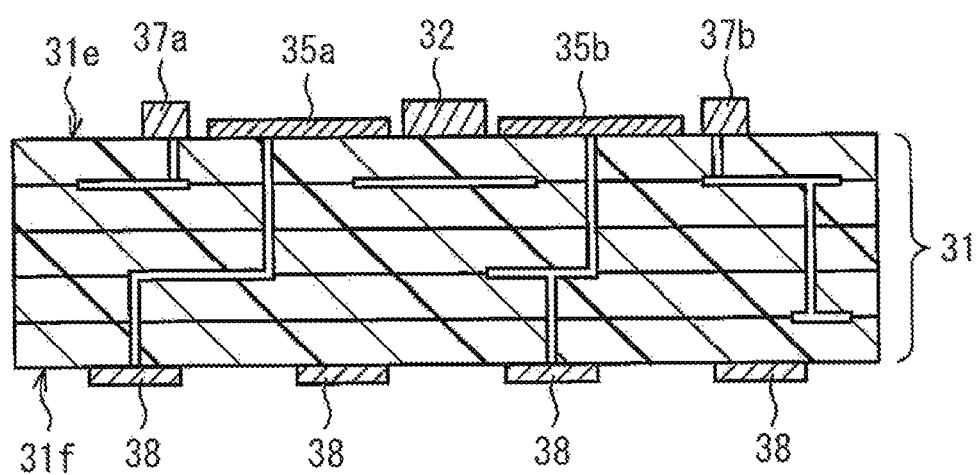
FIGS. 8A to 8G are sectional views illustrating a process of manufacturing the variable filter element.

Firstly, as illustrated in FIG. 8A, the electrode pads 38 are formed on a second surface 31f of the substrate 31 including the multilayer internal wirings. The electrode pads 38 may be formed by, for example, after forming a predetermined metal material as a film on the second surface 31f of the substrate 31 by means of a sputtering method, patterning the metal film by means of a predetermined wet etching or dry etching. Alternatively, in the formation of the electrode pads 38, it is possible to employ a nonelectrolytic plating method or electroplating method. Next, the drive electrodes 35a and 35b are formed on the first surface 31e of the substrate 31. The drive electrodes 35a and 35b may be formed by, for example, after forming a predetermined metal material as a film on the substrate 31 by means of a sputtering method, patterning the metal film by means of a predetermined wet etching or dry etching. It is also acceptable that, after the process of forming the drive electrodes 35a and 35b, a process of forming an insulating film is implemented in such a way as to cover the drive electrodes 35a and 35b. Next, the signal line 32 and anchor sections 37a and 37b are formed on the first surface 31e of the substrate 31. The signal line 32 may be formed by, for example, after forming a resist pattern, which has openings corresponding to the signal line 32 and anchor sections 37a and 37b, on the substrate 31 by means of a patterning, depositing a predetermined metal material (for example, Au), and causing it to grow, in the openings by means of a plating method (a nonelectrolytic plating or electroplating).

Figure 8B:
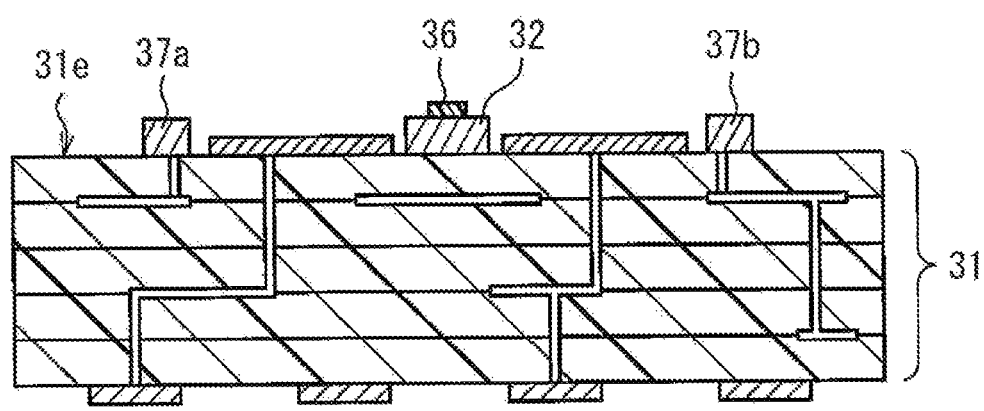

Next, as illustrated in FIG. 8B, the dielectric dot 36 is formed on the signal line 32. The dielectric dot 36 may be formed by, for example, after forming a predetermined dielectric film on the first surface 31e side of the substrate 31, patterning the dielectric film.

Figure 8C:
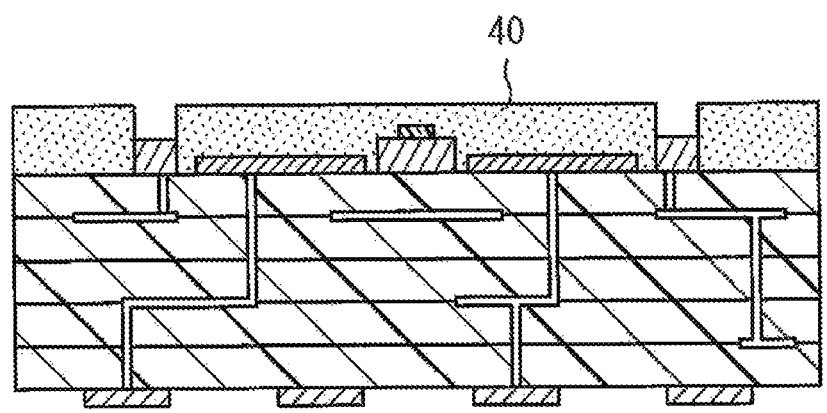

Next, as illustrated in FIG. 8C, a sacrifice layer 40 is formed. The sacrifice layer 40 is formed from a material which, being easy to remove, may be selectively etched.

Figure 8D:
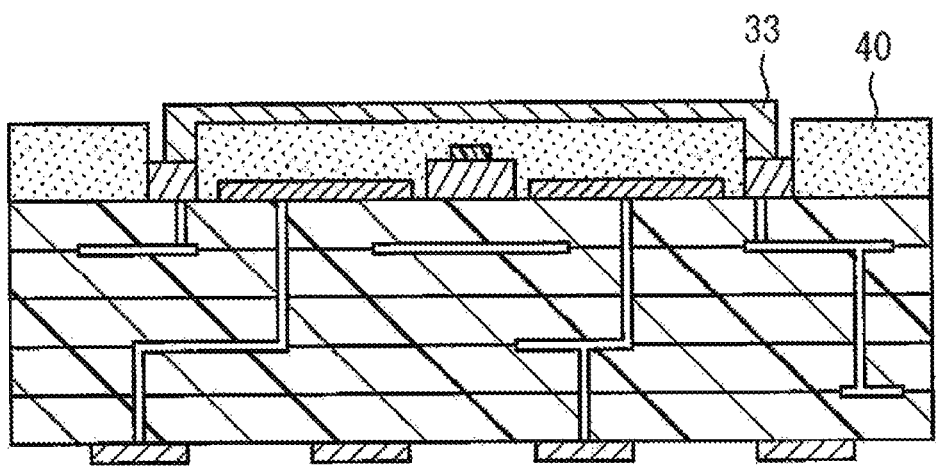
Figure 8E:
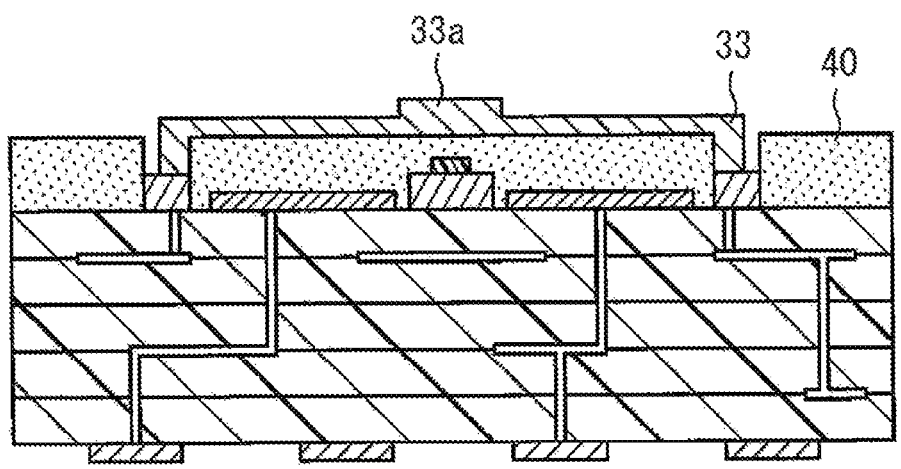

Next, as illustrated in FIG. 8D, the movable capacitor electrode 33 is formed on the sacrifice layer 40. The movable capacitor electrode 33 may be formed by, for example, after forming a predetermined metal material as a film on the sacrifice layer 40 by means of a sputtering method, patterning the metal film by means of a predetermined wet etching or dry etching. Alternatively, the movable capacitor electrode 33 may be formed by employing a nonelectrolytic plating method or electroplating method Next, as illustrated in FIG. 8E, the thick section 33a forming one portion of the movable capacitor electrode 33 is formed. The thick section 33a may be formed by, for example, after forming a resist pattern, which has an opening corresponding to the thick section 33a, over the movable capacitor electrode 33 and sacrifice layer 40 by means of a patterning, depositing a predetermined metal material (for example, Au), and causing it to grow, in the opening by means of a plating method (a nonelectrolytic plating or electroplating).

Figure 8F:
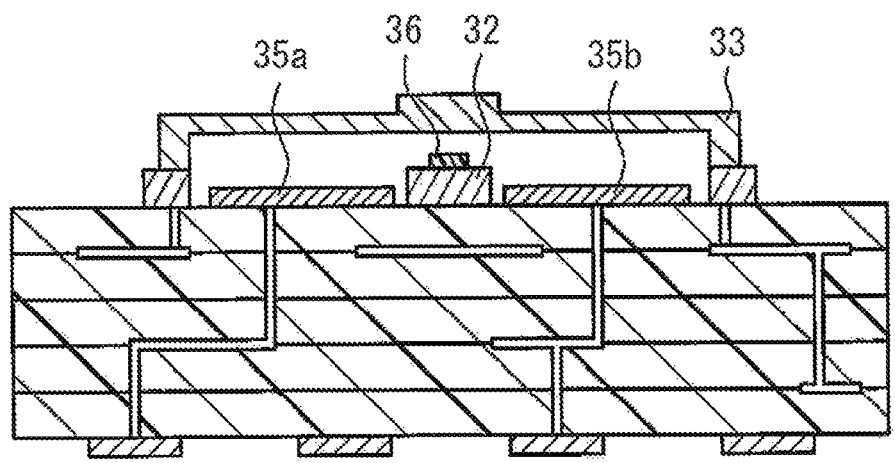

Next, as illustrated in FIG. 8F, the sacrifice layer 40 is removed. By this means, it is possible to form an air gap between the movable capacitor electrode 33 and the signal line 32, drive electrodes 35a and 35b, and dielectric dot 36.

Figure 8G:
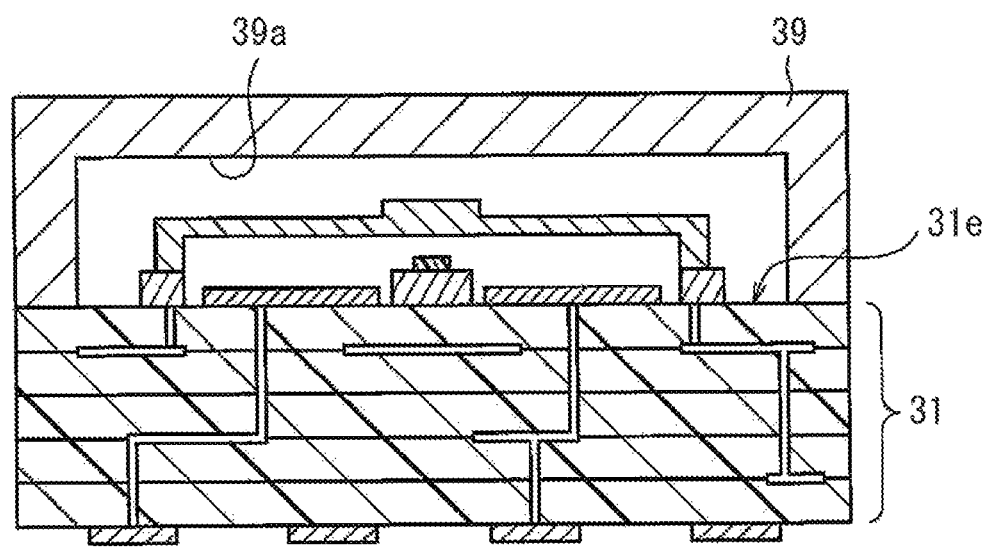

Next, as illustrated in FIG. 8G, the packaging member 39 is bonded to the first surface 31e side of the substrate 31. As a method of bonding the packing member 39 to the substrate 31, it is possible to propose, for example, an anodic bonding method, a direct bonding method, a room temperature bonding method, and a eutectic bonding method. The packaging member 39 being one fabricated by processing an LTCC, a concavity 39a is provided in advance in a portion corresponding to each variable filter formation section of the substrate 31.

Next, the substrate 31 and packaging member 39 are cut into individual variable filters.

By the above means, the variable filter is completed.

The LTCC has been used for the packaging member, but it is also possible to use a dielectric body, such as a resin or ceramic, or a high resistance silicon.

3. Configuration of Communication Module

Figure 9:
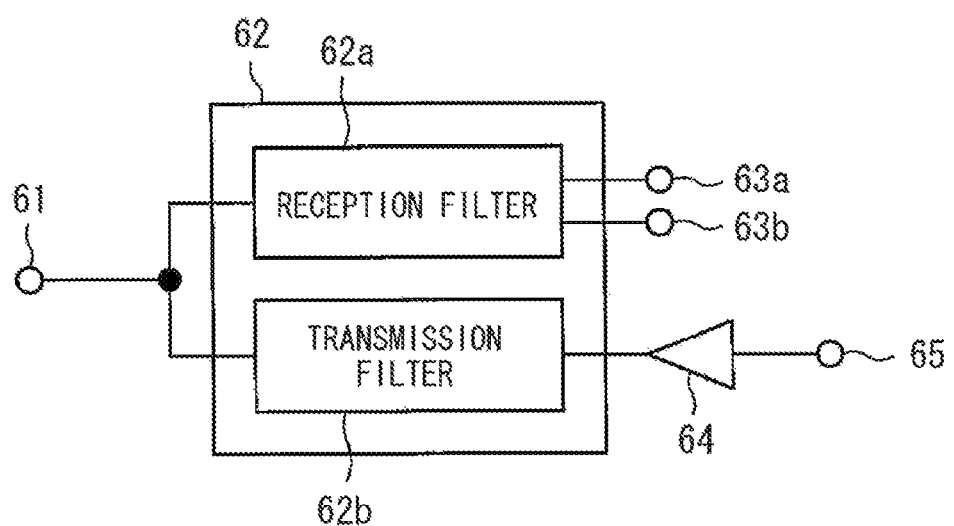
FIG. 9 is a block diagram of a configuration of a communication module.

FIG. 9 illustrates an example of a communication module including the bandpass filter of the embodiment. As illustrated in FIG. 9, a duplexer 62 includes a reception filter 62a and transmission filter 62b. Also, for example, receiving terminals 63a and 63b corresponding to balance outputs are connected to the reception filter 62a. Also, the transmission filter 62b is connected to a transmitting terminal 65 via a power amplifier 64. Herein, the bandpass filter of the embodiment is included in the reception filter 62a and transmission filter 62b.

When carrying out a receiving operation, the reception filter 62a allows only a predetermined frequency band signal, among received signals input via an antenna terminal 61, to pass through, and outputs it from the receiving terminals 63a and 63b to the exterior. Also, when carrying out a transmitting operation, the transmission filter 62b allows only a predetermined frequency band signal, among transmission signals input from the transmitting terminal 65 and amplified by the power amplifier 64, to pass through, and outputs it from the antenna terminal 61 to the exterior.

Figure 10:
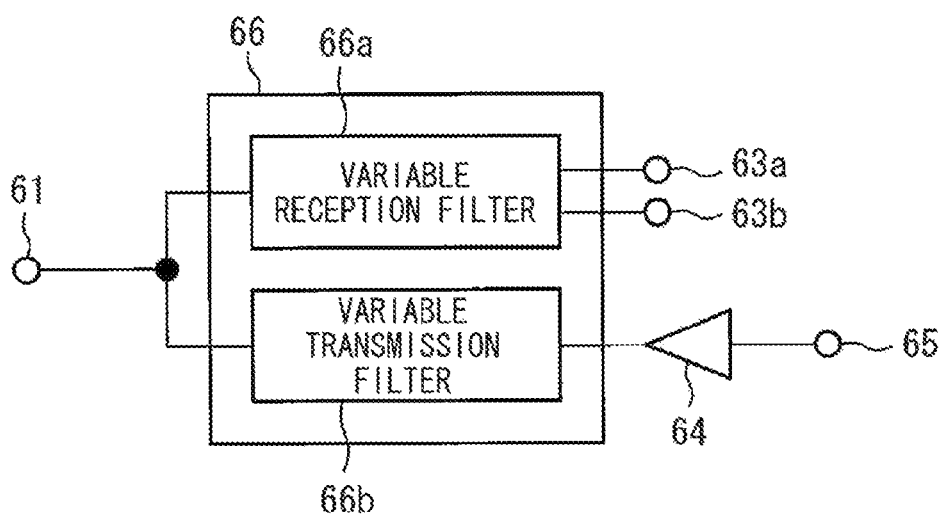
FIG. 10 is a block diagram of a configuration of a communication module including variable filters.

Also, FIG. 10 illustrates a communication module which includes a variable reception filter 66a in place of the reception filter 62a in the communication module illustrated in FIG. 9, and a variable transmission filter 66b in place of the transmission filter 62b. The variable reception filter 66a and variable transmission filter 66b include the variable filter described in the section "2. Configuration of Variable Filter" in the present specification. With a reception filter and transmission filter which cannot vary the passband, in the event of attempting to realize a multiband compatible communication module which may transmit and receive a plurality of high frequency signals in differing frequency bands, the communication module includes reception filters and transmission filters corresponding to the frequency bands, and a switch circuit which switches between the filters for each of the frequency bands in which to transmit and receive the signals, meaning that the communication module is larger in size. As opposed to this, according to the communication module illustrated in FIG. 10, by its including one variable reception filter 66a and one variable transmission filter 66b, it is possible to reduce the number of filters, and it is possible to downsize the multiband compatible communication module.

By including the passband filter of the embodiment in the reception filter 62a and transmission filter 62b of the communication module, as heretofore described, it is possible to downsize the communication module. That is, with a heretofore known filter, as a configuration has been employed wherein a plurality of resonant lines are connected in series, the size in the signal line direction has been increased but, in the embodiment, as a configuration is employed wherein the plurality of resonant lines are connected in parallel in the same position, it is possible to reduce the size of the filter in the signal line direction. Consequently, by mounting the miniaturized filter, it is possible to downsize the communication module. In particular, with a communication module which carries out a high frequency band communication, the number of filters becomes larger, by mounting a filter of which the size in the signal line direction is small, as in the embodiment, it is possible to downsize the communication module. In particular, as the number of filters becomes larger with the communication module which carries out the high frequency band communication, by mounting a filter of which the size in the signal line direction is small, as in the embodiment, it is possible to downsize a communication module compatible with the high frequency band communication.

Also, as it is possible to reduce the passing loss by miniaturizing the filter, it is possible to realize a communication module with superior communication characteristics.

The configurations of the communication modules illustrated in FIGS. 9 and 10 being one example, it is also possible to obtain the same advantages when mounting the passband filter of the embodiment in a communication module of another form.

4. Configuration of Communication Apparatus

Figure 11:
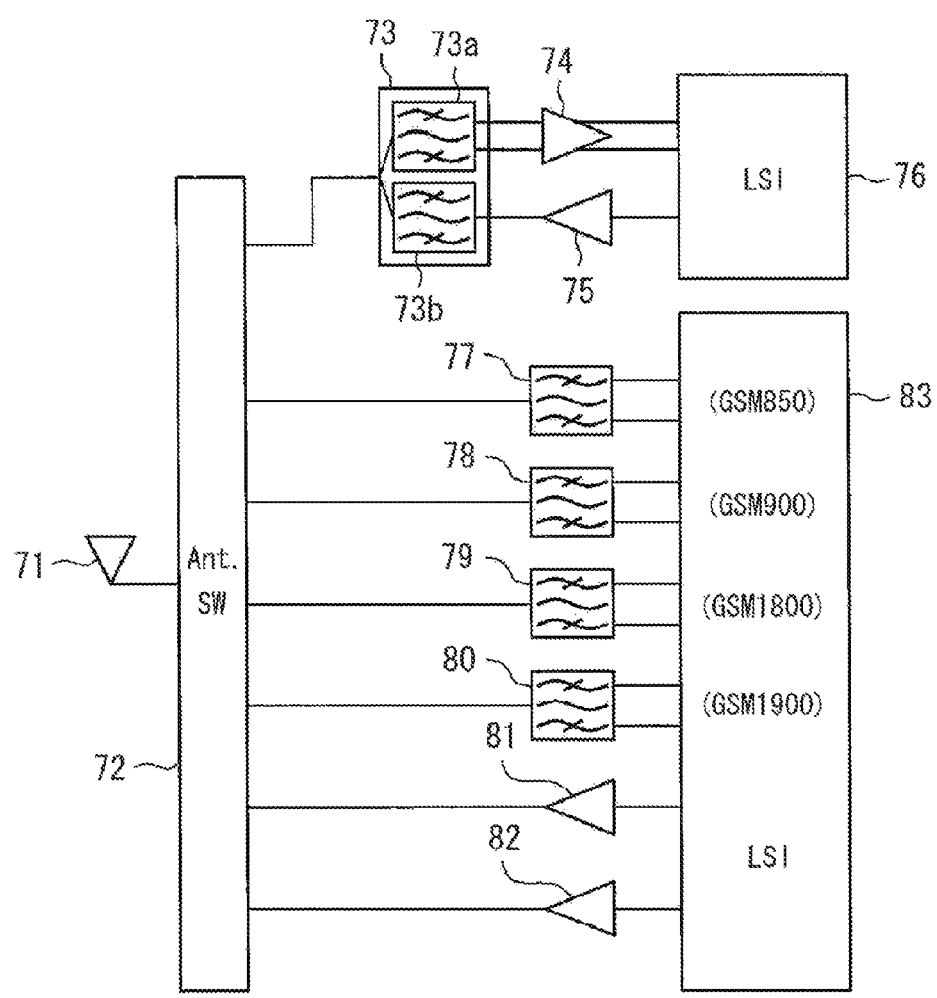
FIG. 11 is a block diagram of a configuration of a communication apparatus.

FIG. 11 illustrates an RF block of a portable telephone terminal as one example of a communication apparatus including the passband filter or communication module of the embodiment. Also, the communication apparatus illustrated in FIG. 11 is illustrated as one example of a portable telephone terminal compatible with a GSM (Global System for Mobile Communications) communication system and W-CDMA (Wideband Code Division Multiple Access) communication system. Also, the GSM communication system in the embodiment is compatible with a 850 MHz band, 950 MHz band, 1.8 GHz band, and 1.9 GHz band. Also, although the portable telephone terminal includes a microphone, a speaker, a liquid crystal display, and the like, apart from the configuration illustrated in FIG. 11, as they are unnecessary in a description in the embodiment, an illustration thereof is omitted. Herein, the bandpass filter in the embodiment is included in reception filters 73a, 77, 78, 79, and 80, and a transmission filter 73b.

Firstly, an LSI to be operated is selected by an antenna switch circuit 72 depending on whether a communication system compatible with a received signal input via an antenna 71 is of the W-CDMA or GSM. In the event that the received signal input is compatible with the W-CDMA communication system, the received signal is switched in such a way as to be output to a duplexer 73. The received signal input into the duplexer 73 is limited to a predetermined frequency band by the reception filter 73a, and a balanced type received signal is output to an LNA 74. The LNA 74 amplifies the input received signal, and outputs it to an LSI 76. The LSI 76, based on the input received signal, carries out a process of demodulation into a sound signal, and controls the drive of each section in the portable telephone terminal.

Meanwhile, when transmitting signals, the LSI 76 generates transmission signals. The generated transmission signals are amplified by a power amplifier 75, and input into the transmission filter 73b. The transmission filter 73b causes only a predetermined frequency band signal, among the input transmission signals, to pass through. The transmission signal output from the transmission filter 73b is output from the antenna 71 to the exterior, via the antenna switch circuit 72.

Also, in the event that the input received signal is a signal compatible with the GSM communication system, the antenna switch circuit 72 selects one of the reception filters 77 to 80 in accordance with the frequency band, and outputs the received signal. The received signal subjected to a band limitation by the selected one of the reception filters 77 to 80 is input into an LSI 83. The LSI 83, based on the input received signal, carries out a process of demodulation into a sound signal, and controls the drive of each section in the portable telephone terminal. Meanwhile, when transmitting signals, the LSI 83 generates transmission signals. The generated transmission signals are amplified by a power amplifier 81 or 82, and output from the antenna 71 to the exterior, via the antenna switch circuit 72.

Figure 12:
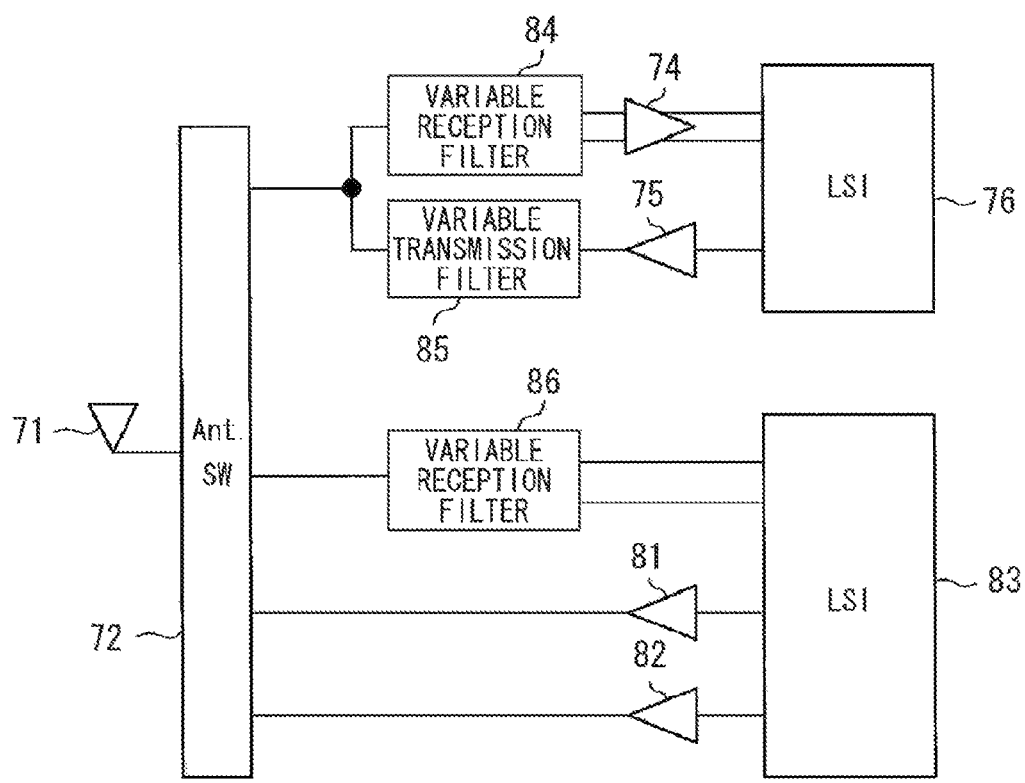
FIG. 12 is a block diagram of a configuration of a communication apparatus including variable filters.

Also, FIG. 12 illustrates a communication apparatus which includes a variable reception filter 84 in place of the reception filter 73a in the communication apparatus illustrated in FIG. 11, and includes a variable transmission filter 85 in place of the transmission filter 73b. Also, the communication apparatus includes a variable reception filter 86 in place of the reception filters 77, 78, 79, and 80. The variable reception filters 84 and 86, and variable transmission filter 85, include the variable filter described in the section "2. Configuration of Variable Filter" in the embodiment. Although not illustrated, the passbands in the variable reception filters 84 and 86, and variable transmission filter 85, are adjusted by a separately provided control circuit.

As heretofore described, by installing in the communication apparatus the filter of which the size in the signal line direction is reduced, it is possible to downsize the communication apparatus. That is, with the heretofore known filter, as a configuration has been employed wherein the plurality of resonant lines are connected in series, the size in the signal line direction has been increased but, in the embodiment, as a configuration is employed wherein the plurality of resonant lines are connected in parallel in the same position, it is possible to reduce the size of the filter in the signal line direction. Consequently, by mounting the miniaturized filter, it is possible to downsize the communication apparatus. In particular, as the number of filters becomes larger with the communication module which carries out a high frequency band communication, by mounting the filter of which the size in the signal line direction is small, as in the embodiment, it is possible to downsize the communication apparatus compatible with the high frequency band communication.

Also, by installing the variable filter, it is possible to selectively transmit and receive a plurality of frequency band signals using one filter, meaning that, it being possible to reduce the number of filters, it is possible to downsize the communication apparatus. Also, as it is possible to reduce the passing loss by miniaturizing the filter, it is possible to realize the communication apparatus with superior communication characteristics.

The communication apparatus of the embodiment is useful for a mobile communication apparatus of which the usable frequency band is approximately 800 MHz to 6 GHz, in particular, a mobile communication apparatus which carries out communication using a frequency band of 2 GHz or higher.

5. Advantages of Embodiment, and Other

According to the embodiment, by connecting a resonant line functioning as a resonator between a signal line and ground, and connecting a plurality of the resonant lines in the same position in the signal line, it is possible to shorten the line length in the signal line direction in comparison with a configuration wherein a plurality of resonant lines are connected in series in the signal line direction, as in the heretofore known technology, so it is possible to reduce the size of the filter in the signal line direction.

Also, by connecting one end of each of the resonant lines to ground, it is possible to shorten the line length of the resonant lines. In the event that the resonant lines are connected in series to the signal line, as in the heretofore known technology, the line length of the resonant lines has been $\lambda/2$ but, by connecting the resonant lines in parallel to the signal line, and connecting one end of each of the resonant lines to ground, as in the embodiment, it is possible to totally reflect a signal which meets the resonant condition, so it is possible to make the length of the resonant lines $\lambda/8 \times n$ (n is a positive integer).

Also, by adopting a configuration wherein the resonant lines are connected in parallel to the signal line, it is possible to mount them in high density on the substrate, so it is possible to miniaturize the filter.

Also, by adopting a configuration wherein a plurality of the resonant lines are connected to a common ground, it is possible to dispose the resonant lines at an angle with respect to the signal line, so it is possible to reduce the size of the filter in the vertical direction (the direction perpendicular to the signal line).

Also, as well as connecting a plurality of the resonant lines to a common ground, by forming the resonant lines, of each of which one end is connected to the signal line, and the other end is connected to the ground, into an approximate arc shape, it is possible to reduce the size of the filter in the vertical direction (the direction perpendicular to the signal line).

Also, by suspending the capacitor electrodes on the resonant lines, it is possible to increase the capacitance in the resonant lines, meaning that, it being possible to shorten the physical line length of the resonant lines, it is possible to reduce the size of the filter in the vertical direction (the direction perpendicular to the signal line).

Also, by suspending the variable capacitor electrodes on the resonant lines, and changing the capacitance in the resonant lines by displacing the variable capacitor electrodes, it is possible to equivalently change the electrical length, so it is possible to realize the variable filter. By employing the variable filter as the reception filter and the transmission filter in the communication module and communication apparatus, there is no need to install the transmission filter and reception filter for each passband in the multiband compatible communication module and communication apparatus, so it is possible to downsize the communication module and communication apparatus.

Also, by miniaturizing the filter, it being possible to increase the number of filter modules which may be obtained from one wafer at the time of filter manufacture, it is possible to reduce a manufacturing cost.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A filter comprising:
   a substrate;
   a signal line formed on the substrate and including an input terminal and an output terminal at either end of the signal line;
   a first pair of resonant lines connected between the signal line and a ground portion, wherein one ends of the first pair of resonant lines are connected to the signal line at a first point;
   a second pair of resonant lines connected between the signal line and the ground portion, wherein one ends of the second pair of resonant lines are connected to the signal line at a second point; and
   a coupling section provided between the first pair of resonant lines and the second pair of resonant lines,
   wherein each of the first pair of resonant lines and each of the second pair of resonant lines are provided obliquely with respect to the signal line, the other end of one of the first pair of resonant lines and the other end of one of the second pair of resonant lines are connected to the ground portion at a third point, and the other end of the other of the first pair of resonant lines and the other end of the other of the second pair of resonant lines are connected to the ground portion at a fourth point,
   wherein the coupling section includes a distributed constant element connected to the signal line and two inductors connected between the signal line and the ground portion,
   wherein one end of the distributed constant element is connected to the input terminal via the signal line, and the other end of the distributed constant element is connected to the output terminal via the signal line.

2. The filter according to claim 1, wherein the first point is positioned at a side of the input terminal and the second point is positioned at a side of the output terminal.

3. The filter according to claim 1, wherein one end of one of the two inductors is connected to the signal line at the first point, the other end of the one of the two inductors is connected to the ground portion at the third point, one end of the other of the two inductors is connected to the signal line at the second point, and the other end of the other of the two inductors is connected to the ground portion at the fourth point.

4. The filter according to claim 1, wherein the first pair of resonant lines and the second pair of resonant lines are formed into an arc shape.

5. The filter according to claim 1, wherein the substrate is a ceramic substrate including a plurality of laminated internal wirings.

* * * * *